(12) United States Patent
Koshitouge

(10) Patent No.: US 9,891,354 B2
(45) Date of Patent: Feb. 13, 2018

(54) LIGHT-EXTRACTION FILM FOR EL, METHOD FOR MANUFACTURING LIGHT-EXTRACTION FILM FOR EL, AND PLANAR LIGHT-EMITTING BODY

(71) Applicant: Mitsubishi Rayon Co., Ltd., Chiyoda-ku (JP)

(72) Inventor: Haruki Koshitouge, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 14/896,448

(22) PCT Filed: Jun. 6, 2014

(86) PCT No.: PCT/JP2014/065108
§ 371 (c)(1),
(2) Date: Dec. 7, 2015

(87) PCT Pub. No.: WO2014/199921
PCT Pub. Date: Dec. 18, 2014

(65) Prior Publication Data
US 2016/0131806 A1 May 12, 2016

(30) Foreign Application Priority Data

Jun. 12, 2013 (JP) .................. 2013-123456

(51) Int. Cl.
*G02B 5/02* (2006.01)
*H01L 51/52* (2006.01)
(Continued)

(52) U.S. Cl.
CPC ...... *G02B 5/0242* (2013.01); *B29D 11/00788* (2013.01); *B32B 3/30* (2013.01);
(Continued)

(58) Field of Classification Search
CPC .......... H01L 51/5268; H01L 2251/558; H01L 2251/5369; H01L 51/5257; H01L 51/5262;
(Continued)

(56) References Cited

U.S. PATENT DOCUMENTS 6,002,464 A * 12/1999 Fujisawa ........... G02F 1/133504
349/112
2001/0053074 A1* 12/2001 Onishi .................... F21V 5/02
362/617
(Continued)

FOREIGN PATENT DOCUMENTS

JP 2000063447 A * 2/2000 ............... G02B 3/08
JP 2010-102965 A 5/2010
(Continued)

OTHER PUBLICATIONS

Translation of JP2000-063447 A (Nakayama et al) (Feb. 29, 2000), 8 pages.*

(Continued)

*Primary Examiner* — Caridad Everhart
(74) *Attorney, Agent, or Firm* — Morgan, Lewis & Bockius LLP

(57) ABSTRACT

This light-extraction film for EL includes a diffusion layer and an uneven-structure layer, the diffusion layer including first light-diffusion fine particles, and the uneven-structure layer including second light-diffusion fine particles as desired, and satisfying the expression Px−Py≥5 mass %. (Px represents the content ratio of the first light-diffusion fine particles to the total mass of the diffusion layer. Py represents the content ratio of the second light-diffusion fine particles to the total mass of the uneven structure layer.)

17 Claims, 5 Drawing Sheets

(51) Int. Cl.
*B29D 11/00* (2006.01)
*B32B 3/30* (2006.01)
*B32B 7/02* (2006.01)
*G02B 3/00* (2006.01)
*B29K 67/00* (2006.01)
*B29K 233/04* (2006.01)
*B29K 69/00* (2006.01)

(52) U.S. Cl.
CPC .............. *B32B 7/02* (2013.01); *G02B 3/0056* (2013.01); *G02B 3/0068* (2013.01); *G02B 5/0268* (2013.01); *G02B 5/0278* (2013.01); *H01L 51/5275* (2013.01); *B29K 2067/003* (2013.01); *B29K 2069/00* (2013.01); *B29K 2233/04* (2013.01); *B29K 2995/0018* (2013.01); *B32B 2457/206* (2013.01); *H01L 51/5268* (2013.01); *H01L 2251/5361* (2013.01); *H01L 2251/5369* (2013.01); *H01L 2251/55* (2013.01); *H01L 2251/558* (2013.01)

(58) Field of Classification Search
CPC .......... H01L 2251/5361; G02B 5/0268; G02B 5/0278; G02B 5/0242; G02B 5/02; B32B 7/02; B29D 11/00788
See application file for complete search history.

(56) References Cited

U.S. PATENT DOCUMENTS

| | | | |
|---|---|---|---|
| 2006/0072197 A1* | 4/2006 | Iwata | G02B 5/128 359/529 |
| 2011/0278557 A1* | 11/2011 | Konno | H01L 51/5268 257/40 |
| 2012/0193645 A1 | 8/2012 | Krummacher et al. | |
| 2012/0248974 A1* | 10/2012 | Inoue | G02B 5/0231 313/504 |
| 2013/0062654 A1* | 3/2013 | Taima | G02B 5/0242 257/98 |
| 2015/0176797 A1* | 6/2015 | Inoue | H01L 51/5268 362/311.01 |

FOREIGN PATENT DOCUMENTS

| | | | |
|---|---|---|---|
| JP | 2012-003074 A | 1/2012 | |
| JP | 2012-530336 A | 11/2012 | |
| JP | 5157294 B | 3/2013 | |
| JP | 5157294 B2 * | 3/2013 | .............. G02B 5/02 |
| WO | 2013/080794 A1 | 6/2013 | |

OTHER PUBLICATIONS

International Search Report dated Jul. 8, 2014, for International application No. PCT/JP2014/065108.

* cited by examiner

[Fig. 1]
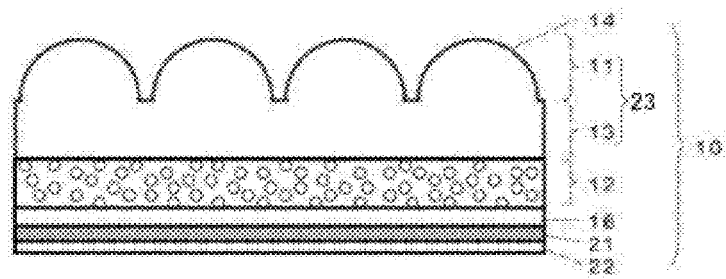
[Fig. 2A]
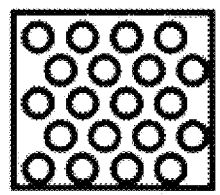
[Fig. 2B]
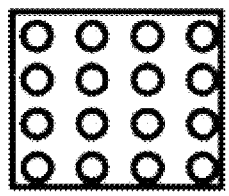
[Fig. 2C]
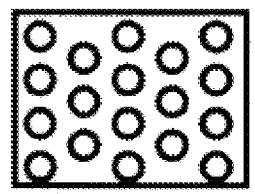

[Fig. 2D]
[Fig. 2E]
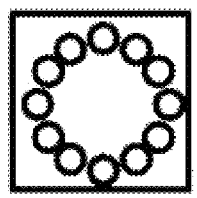
[Fig. 2F]
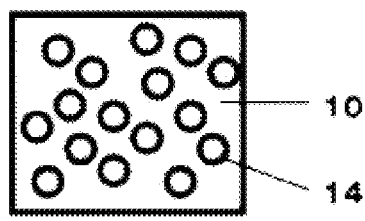

[Fig. 3A]
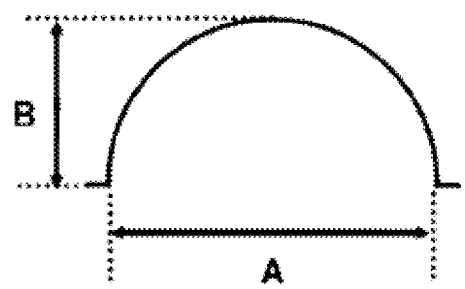
[Fig. 3B]
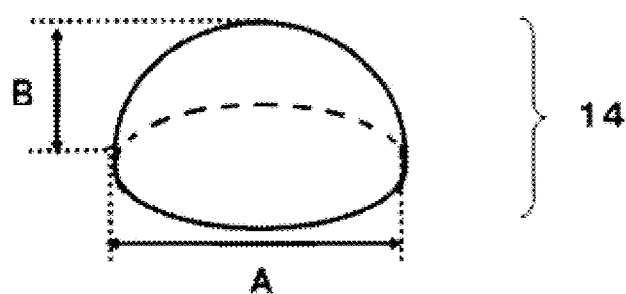
[Fig. 4]
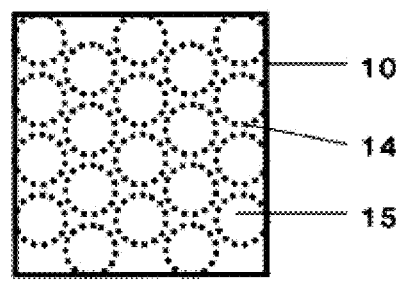

[Fig. 5]
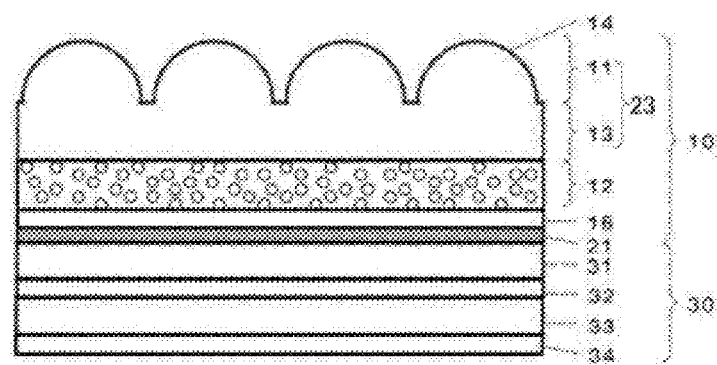
[Fig. 6]
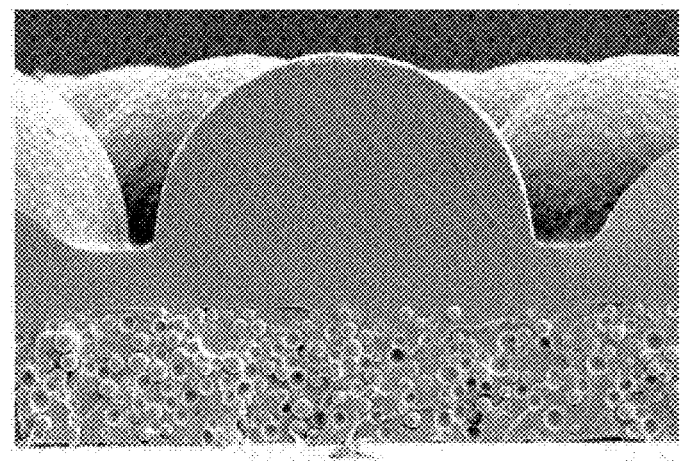

[Fig. 7]
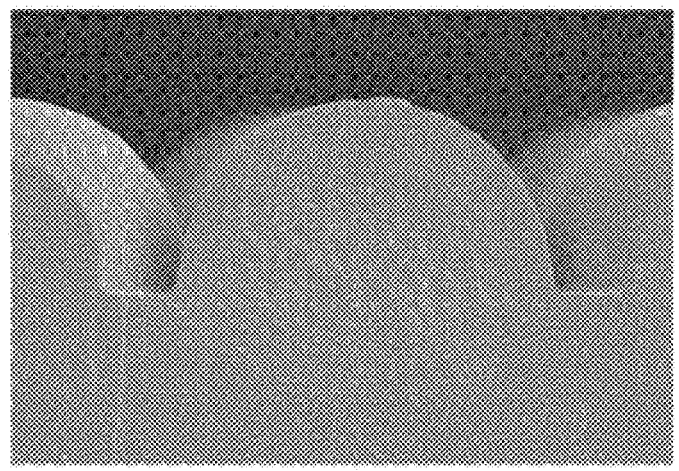

LIGHT-EXTRACTION FILM FOR EL, METHOD FOR MANUFACTURING LIGHT-EXTRACTION FILM FOR EL, AND PLANAR LIGHT-EMITTING BODY

TECHNICAL FIELD

The present invention relates to a light extraction film for EL, a method for producing a light extraction film for EL, and a surface light-emitting body.

This application claims priority based on Japanese Patent Application No. 2013-123456 which has been filed in Japan on Jun. 12, 2013, and the content of which is incorporated herein by reference.

BACKGROUND ART

Among surface light-emitting bodies, an organic electroluminescent (EL) light-emitting element is expected to be used in a flat panel display and also in a new generation lighting device that is used in place of a fluorescent bulb and the like.

The structure of the organic EL light-emitting element is diversified, that is, from a simple structure in which an organic thin film to be a light emitting layer is merely interposed between two electrodes to a structure in which a light emitting layer is provided and an organic thin film is multi-layered. As an example of the latter multi-layered structure, those obtained by laminating a hole transporting layer, a light emitting layer, an electron transporting layer, and a negative electrode on a positive electrode formed on a glass substrate are exemplified. The layer interposed between the positive electrode and the negative electrode entirely consists of an organic thin film, and the thickness of each organic thin film is extremely thin, that is, only several tens of nm.

The organic EL light-emitting element is a laminate of thin films, and based on a difference in refractive index between materials of each thin film, the total reflection angle of the light between the thin films is determined. Under the current circumstances, about 80% of the light generated from the light emitting layer is trapped inside the organic EL light-emitting element and cannot be extracted to the outside. Specifically, when the refractive index of the glass substrate is 1.5 and the refractive index of an air layer is 1.0, a critical angle $\theta_c$ is 41.8° and the light with the incidence angle lower than the critical angle $\theta_c$ is emitted from the glass substrate to the air layer. However, the light with the incidence angle higher than the critical angle $\theta_c$ undergoes total reflection and is trapped inside the glass substrate. For such reasons, it has been desired to extract the light trapped inside the glass substrate on the surface of the organic EL light-emitting element to the outside of the glass substrate, that is, to improve light extraction efficiency.

Furthermore, regarding an organic EL light-emitting element which performs isotropic light emission, it is desired to have not only improvement in the light extraction efficiency but also a decrease in the emission angle dependence of the wavelength of light emitted from the organic EL light-emitting element. That is, it is desired to have a small difference in emission angle according to the wavelength when light emitted from the light emitting layer passes through the glass substrate to result in light emission from the glass substrate. In other words, the wavelength dependence of the light distribution emitted from the glass substrate is desired to be as small as possible.

In order to solve the problems described above, Patent Document 1 proposes a lens sheet including a diffusion layer in which particles increases toward a light emitting surface side and a recessed and projected structure layer including particles.

CITATION LIST

Patent Document

Patent Document 1: JP 5157294 B1

SUMMARY OF THE INVENTION

Problem to be Solved by the Invention

However, in the lens sheet described in Patent Document 1, although the emission angle dependence of the wavelength of light emitted from the surface light-emitting body is suppressed, the lens sheet is inferior in the light extraction efficiency of the surface light-emitting body. Furthermore, from a manufacturing process point of view, it is difficult to achieve the localization of particles in the diffusion layer such as a case where particles increases toward a light emitting surface side, and the lens sheet is inferior in productivity.

In this regard, an object of the invention is to provide a light extraction film for EL in which a balance between improvement in light extraction efficiency of a surface light-emitting body and suppression of emission angle dependence of the wavelength of light emitted from the surface light-emitting body is achieved, a method for producing a light extraction film for EL which is excellent in productivity, and a surface light-emitting body in which a balance between improvement in light extraction efficiency and suppression of emission angle dependence of the wavelength of emitted light is achieved.

Means for Solving Problem

The invention provides a light extraction film for EL, a method for producing a light extraction film for EL, and a surface light-emitting body in order to solve the above-described problems, and has the following aspects.

(1) A light extraction film for EL, including a diffusion layer and a recessed and projected structure layer, in which the diffusion layer includes first light-diffusion fine particles, the recessed and projected structure layer includes second light-diffusion fine particles as desired, and the following Expression (1) is satisfied:

$$Px-Py \geq 5\% \text{ by mass} \quad (1)$$

(Px represents a content ratio of the first light-diffusion fine particles to the total mass of the diffusion layer; and Py represents a content ratio of the second light-diffusion fine particles to the total mass of the recessed and projected structure layer).

(2) The light extraction film for EL described in (1), further including a base material, in which the diffusion layer and the recessed and projected structure layer are sequentially provided on the base material.

(3) The light extraction film for EL described in (1) or (2), in which the content ratio Px of the first light-diffusion fine particles to the total mass of the diffusion layer is 10% by mass or more.

(4) The light extraction film for EL described in any one of (1) to (3), in which the diffusion layer includes a first resin, and the first light-diffusion fine particles included in the diffusion layer are evenly dispersed in the first resin.

(5) The light extraction film for EL described in (4), in which a difference between a refractive index Rxm of the first resin and a refractive index Rxp of the first light-diffusion fine particles included in the diffusion layer is 0.05 to 0.30.

(6) The light extraction film for EL described in (4) or (5), in which a difference between the refractive index Rxm of the first resin and the refractive index Rxp of the first light-diffusion fine particles included in the diffusion layer is 0.15 to 0.30.

(7) The light extraction film for EL described in any one of (1) to (6), in which a thickness of the diffusion layer is 1 μm to 50 μm.

(8) The light extraction film for EL described in any one of (1) to (7), in which the content ratio Py of the second light-diffusion fine particles to the total mass of the recessed and projected structure layer is 20% by mass or less.

(9) The light extraction film for EL described in any one of (1) to (8), in which the second light-diffusion fine particles are not substantially included in the recessed and projected structure layer.

(10) The light extraction film for EL described in any one of (1) to (9), in which the recessed and projected structure layer includes a second resin, and a refractive index Rym of the second resin is 1.40 to 1.80.

(11) The light extraction film for EL described in (10), in which the refractive index Rym of the second resin is 1.55 to 1.80.

(12) A surface light-emitting body including the light extraction film for EL described in any one of (1) to (11) and an EL light-emitting element.

(13) The surface light-emitting body described in (12), in which an amount of chromatic variation Δu'v' of the surface light-emitting body is 0.01 or less.

(14) A method for producing a light extraction film for EL, the method including: supplying an active energy ray curable resin composition to a space between a diffusion sheet and a mold having a transferring portion of a recessed and projected structure; and irradiating the active energy ray curable resin composition with an active energy ray.

Effect of the Invention

According to the light extraction film for EL of the invention, it is possible to obtain a surface light-emitting body which is excellent in light extraction efficiency and suppresses emission angle dependence of the wavelength of emitted light. Furthermore, the method for producing a light extraction film for EL of the invention is excellent in productivity, and according to the light extraction film for EL to be obtained by the method, it is possible to obtain a surface light-emitting body which is excellent in light extraction efficiency and suppresses emission angle dependence of the wavelength of emitted light. Further, the surface light-emitting body of the invention is excellent in light extraction efficiency and can suppress emission angle dependence of the wavelength of emitted light.

BRIEF DESCRIPTION OF DRAWINGS

FIG. 1 is a schematic diagram illustrating an example of a cross section of a light extraction film for EL of the invention;

FIG. 2A is a schematic diagram illustrating an arrangement example of a recessed and projected structure of the light extraction film for EL of the invention when viewed from the upper side of an optical film;

FIG. 2B is a schematic diagram illustrating an arrangement example of the recessed and projected structure of the light extraction film for EL of the invention when viewed from the upper side of the optical film;

FIG. 2C is a schematic diagram illustrating an arrangement example of the recessed and projected structure of the light extraction film for EL of the invention when viewed from the upper side of the optical film;

FIG. 2D is a schematic diagram illustrating an arrangement example of the recessed and projected structure of the light extraction film for EL of the invention when viewed from the upper side of the optical film;

FIG. 2E is a schematic diagram illustrating an arrangement example of the recessed and projected structure of the light extraction film for EL of the invention when viewed from the upper side of the optical film;

FIG. 2F is a schematic diagram illustrating an arrangement example of the recessed and projected structure of the light extraction film for EL of the invention when viewed from the upper side of the optical film;

FIG. 3A is a schematic diagram illustrating an example of the recessed and projected structure of the light extraction film for EL of the invention;

FIG. 3B is a schematic diagram illustrating an example of the recessed and projected structure of the light extraction film for EL of the invention;

FIG. 4 is a schematic diagram illustrating an example of the light extraction film for EL of the invention when viewed from the upper side of the optical film;

FIG. 5 is a schematic diagram illustrating an example of a surface light-emitting body of the invention;

FIG. 6 shows an image obtained by photographing a cross section of a light extraction film for EL produced in Example 4 by a scanning microscope; and FIG. 7 shows an image obtained by photographing a cross section of a light extraction film for EL produced in Comparative Example 1 by a scanning microscope.

MODE(S) FOR CARRYING OUT THE INVENTION

Hereinafter, an embodiment of the invention will be described with reference to the drawings, but the invention is not limited to these drawings.

(Light Extraction Film 10 for EL)

A light extraction film 10 for EL of the invention includes a diffusion layer 12 and a recessed and projected structure layer 11.

As the light extraction film 10 for EL of the invention, for example, the light extraction film 10 for EL as illustrated in FIG. 1 or the like is exemplified in which the recessed and projected structure layer 11 is laminated on the diffusion layer 12, which is laminated on a base material 16, with an intermediate layer 13 interposed therebetween.

In the light extraction film 10 for EL of the invention, from the viewpoint of having excellent productivity or handlability and excellent light extraction efficiency of the surface light-emitting body, it is preferable that the diffusion layer 12 and the recessed and projected structure layer 11 be sequentially laminated on the base material 16 and it is more preferable that the diffusion layer 12, the intermediate layer 13, and the recessed and projected structure layer 11 are sequentially laminated on the base material 16.

(Recessed and Projected Structure Layer 11)

In the recessed and projected structure layer 11, projections or depressions of the recessed and projected structure 14 are arranged.

Regarding projections or depressions of the recessed and projected structure layer 11, from the viewpoint of having excellent productivity of the light extraction film 10 for EL, projections are preferable.

Examples of the shape of the recessed and projected structure 14 include a spherical segment shape, a spherical segment trapezoidal shape, an ellipsoid spherical segment shape (a shape obtained by cutting a spheroid with one plane), an ellipsoid spherical segment trapezoidal shape (a shape obtained by cutting a spheroid with two planes that are parallel to each other), a pyramid shape, a pyramid trapezoidal shape, a conical shape, a conical trapezoidal shape, and roof-like shapes relating to these shapes (a shape in which a spherical segment shape, a spherical segment trapezoidal shape, an ellipsoid spherical segment shape, an ellipsoid spherical segment trapezoidal shape, a pyramid shape, a pyramid trapezoidal shape, a conical shape, or a conical trapezoidal shape extends along a bottom surface portion). These shapes of the recessed and projected structure 14 may be used alone or in combination of two or more kinds thereof. Among these shapes of the recessed and projected structure 14, from the viewpoint of having excellent light extraction efficiency or luminance in the normal direction of the surface light-emitting body, spherical shapes such as a spherical segment shape, a spherical segment trapezoidal shape, an ellipsoid spherical segment shape, and an ellipsoid spherical segment trapezoidal shape are preferable, and a spherical segment shape and an ellipsoid spherical segment shape are more preferable.

Incidentally, the spherical shape may not be a perfect spherical shape and may be a substantially spherical shape. The substantially spherical shape indicates a shape in which the surface of the spherical shape is deviated from the surface of a virtual perfect sphere circumscribing the spherical shape or from the center of the virtual perfect sphere with respect to the normal direction, and the deviation amount thereof may be 0 to 20% relative to the radius of the virtual perfect sphere.

Furthermore, in a case where the shape is expressed as "ellipse" in the present specification, a circular shape in which a perfect circular shape extends in one direction or in multi-directions is also included.

An arrangement example of the recessed and projected structure 14 is illustrated in FIGS. 2A to 2F.

Examples of the arrangement of the recessed and projected structure 14 include hexagonal alignment (FIG. 2A), rectangular alignment (FIG. 2B), diamond alignment (FIG. 2C), linear alignment (FIG. 2D), circular alignment (FIG. 2E), and random alignment (FIG. 2F). The hexagonal alignment indicates a case where the recessed and projected structure 13 is arranged at each vertex of a hexagonal shape and the center thereof and the arrangement of the hexagonal shape is continuously aligned. The rectangular alignment indicates a case where the recessed and projected structure 13 is arranged at each vertex of a rectangular shape and the arrangement of the rectangular shape is continuously aligned. The diamond alignment indicates a case where the recessed and projected structure 13 is arranged at each vertex of a diamond shape and the arrangement of the diamond shape is continuously aligned. The linear alignment indicates a case where the recessed and projected structure 13 is arranged in a linear shape. The circular alignment indicates a case where the recessed and projected structure 13 is arranged along the circle.

Among these examples of arrangement of the recessed and projected structure 14, from the viewpoint of having excellent light extraction efficiency or luminance in the normal direction of the surface light-emitting body, hexagonal alignment, rectangular alignment, and diamond alignment are preferable, and hexagonal alignment and rectangular alignment are more preferable.

An example of the recessed and projected structure 14 is illustrated in FIG. 3A and FIG. 3B.

In the present specification, a bottom surface portion 15 of the recessed and projected structure 14 is a virtual planar portion surrounded by an outer peripheral edge of a bottom portion (in the case of having the intermediate layer 13, a contact surface that comes in contact with the intermediate layer 13) of the recessed and projected structure 14.

Furthermore, in the present specification, a maximum diameter A of the bottom surface portion 15 of the recessed and projected structure 14 indicates a length of the longest part of the bottom surface portion 15 of the recessed and projected structure 14, and an average maximum diameter $A_{ave}$ of the bottom surface portion 15 of the recessed and projected structure 14 is obtained by photographing the surface, which has the recessed and projected structure 14, of an optical film 10 by a scanning microscope, measuring the maximum diameter A of the bottom surface portion 15 of the recessed and projected structure 14 at arbitrary five positions, and averaging the values thus measured.

Further, in the present specification, in the case of the projection structure, a height B of the recessed and projected structure 14 indicates a height from the bottom surface portion 15 of the recessed and projected structure 14 to the highest part of the recessed and projected structure 14, and in the case of the depression structure, the height B indicates a height from the bottom surface portion 15 of the recessed and projected structure 14 to the lowest part of the recessed and projected structure 14. An average height $B_{ave}$ of the recessed and projected structure 14 is obtained by photographing the cross section of the optical film 10 by a scanning microscope, measuring the height B of the recessed and projected structure 14 at arbitrary five positions, and averaging the values thus measured.

The average maximum diameter $A_{ave}$ of the bottom surface portion 15 of the recessed and projected structure 14 is preferably 0.5 μm to 150 μm, more preferably 1 μm to 130 μm, and even more preferably 2 μm to 100 μm, from the viewpoint of having excellent light extraction efficiency or luminance in the normal direction of the surface light-emitting body.

The average height $B_{ave}$ of the recessed and projected structure 14 is preferably 0.25 μm to 75 μm, more preferably 0.5 μm to 65 μm, and even more preferably 1 μm to 50 μm, from the viewpoint of having excellent light extraction efficiency or luminance in the normal direction of the surface light-emitting body.

An aspect ratio of the recessed and projected structure 14 is preferably 0.3 to 1.4, more preferably 0.35 to 1.3, and even more preferably 0.4 to 1.0, from the viewpoint of having excellent light extraction efficiency or luminance in the normal direction of the surface light-emitting body.

Incidentally, the aspect ratio of the recessed and projected structure 14 is calculated from the average height $B_{ave}$ of the recessed and projected structure 14/the average maximum diameter $A_{ave}$ of the bottom surface portion 15 of the recessed and projected structure 14.

Examples of the shape of the bottom surface portion 15 of the recessed and projected structure 14 include a circular shape, an elliptical shape, and a rectangular shape. These shapes of the bottom surface portion 15 of the recessed and projected structure 14 may be used alone or in combination of two or more kinds thereof. Among the shapes of the bottom surface portion 15 of the recessed and projected structure 14, from the viewpoint of having excellent light extraction efficiency or luminance in the normal direction of the surface light-emitting body, a circular shape and an elliptical shape are preferable and a circular shape is more preferable.

Incidentally, the circular shape may not be a perfect circular shape and may be a substantially circular shape. The substantially circular shape indicates a shape in which the surface of the circular shape is deviated from the circumference of a virtual perfect circular shape circumscribing the circular shape with respect to the normal direction of the virtual perfect circular shape, and the deviation amount thereof may be 0 to 20% relative to the radius of the virtual perfect circular shape.

An example of the light extraction film 10 for EL viewed from the upper side thereof is illustrated in FIG. 4.

A ratio of an area of the bottom surface portion 15 of the recessed and projected structure 14 (an area surrounded by a dotted line in FIG. 4) to an area of the light extraction film 10 for EL (an area surrounded by a solid line in FIG. 4) is preferably 20 to 99%, more preferably 25 to 95%, and even more preferably 30 to 93%, from the viewpoint of having excellent light extraction efficiency or luminance in the normal direction of the surface light-emitting body.

Incidentally, in a case where the bottom surface portions 15 of the recessed and projected structures 14 are all circular shapes of the same size, the maximum value of the ratio of the area of the bottom surface portion 15 of the recessed and projected structure 14 to the area of the light extraction film 10 for EL is about 91%.

The material of the recessed and projected structure layer 11 is not particularly limited as long as it is a material with a high light transmittance in the wavelength range of visible light (about 400 nm to 700 nm). Specifically, regarding the visible light transmittance of the material of the recessed and projected structure layer 11, a value measured in conformity with ISO 13468 is preferably 50% or more and more preferably 50% to 100%. For example, glass, a resin, and the like are exemplified. Among these materials of the recessed and projected structure layer 11, from the viewpoint of having excellent productivity of the light extraction film 10 for EL, a resin is preferable. In the present specification, a resin that is a material of the recessed and projected structure layer 11 is referred to as a second resin.

(Second Resin)

The second resin in the recessed and projected structure layer 11 is not particularly limited as long as it is a resin with a high light transmittance in the wavelength range of visible light (about 400 nm to 700 nm) as described above, but examples thereof include acrylic resins; polycarbonate resins; polyester resins such as polyethylene terephthalate, polybutylene terephthalate, and polyethylene naphthalate; styrene resins such as polystyrene and an ABS resin; and vinyl chloride resins. Among these second resins in the recessed and projected structure layer 11, acrylic resins are preferable, from the viewpoint of having a high light transmittance in the wavelength range of visible light and excellent heat resistance, dynamic properties, and molding processability.

From the viewpoint of having excellent productivity of the light extraction film 10 for EL, the second resin in the recessed and projected structure layer 11 is preferably a resin obtained by curing an active energy ray curable composition with irradiation of an active energy ray.

Examples of the active energy ray include ultraviolet rays, electron beams, X rays, infrared rays, and visible rays.

Among these active energy rays, from the viewpoint of having an excellent curing property of an active energy ray curable composition and the viewpoint that deterioration of the light extraction film 10 for EL can be suppressed, ultraviolet rays and electron beams are preferable and ultraviolet rays are more preferable.

The active energy ray curable composition is not particularly limited as long as it can be cured by an active energy ray. However, from the viewpoint of having excellent handlability or an excellent curing property of an active energy ray curable composition and various excellent physical properties of the optical film 10 such as flexibility, heat resistance, abrasion resistance, solvent resistance, and a light transmitting property, an active energy ray curable composition containing a polymerizable monomer (A), a cross-linkable monomer (B), and a polymerization initiator (C) described below is preferable.

Examples of the polymerizable monomer (A) include (meth)acrylates such as methyl(meth)acrylate, ethyl(meth)acrylate, n-propyl(meth)acrylate, iso-propyl(meth)acrylate, n-butyl(meth)acrylate, iso-butyl(meth)acrylate, sec-butyl(meth)acrylate, tert-butyl(meth)acrylate, n-hexyl(meth)acrylate, cyclohexyl(meth)acrylate, n-octyl(meth)acrylate, 2-ethylhexyl(meth)acrylate, dodecyl(meth)acrylate, tridecyl(meth)acrylate, stearyl(meth)acrylate, alkyl(meth)acrylate, phenyl(meth)acrylate, benzyl(meth)acrylate, phenoxyethyl(meth)acrylate, isobornyl(meth)acrylate, glycidyl(meth)acrylate, tetrahydrofurfuryl(meth)acrylate, norbornyl(meth)acrylate, adamantyl(meth)acrylate, dicyclopentenyl(meth)acrylate, dicyclopentanyl(meth)acrylate, tetracyclododecanyl(meth)acrylate, cyclohexane dimethanol mono(meth)acrylate, 2-hydroxyethyl(meth)acrylate, 2-hydroxypropyl(meth)acrylate, 3-hydroxypropyl(meth)acrylate, 2-hydroxybutyl(meth)acrylate, 3-hydroxybutyl(meth)acrylate, 4-hydroxybutyl(meth)acrylate, 2-methoxyethyl(meth)acrylate, 2-ethoxyethyl(meth)acrylate, 3-methoxybutyl(meth)acrylate, butoxyethyl(meth)acrylate, methoxytriethylene glycol(meth)acrylate, methoxydipropylene glycol(meth)acrylate, 2-(meth)acryloyloxymethyl-2-methylbicycloheptane, 4-(meth)acryloyloxymethyl-2-methyl-2-ethyl-1,3-dioxolane, 4-(meth)acryloyloxymethyl-2-methyl-2-isobutyl-1,3-dioxolane, trimethylol propaneformal(meth)acrylate, ethylene oxide-modified phosphoric acid(meth)acrylate, and caprolactone-modified phosphoric acid(meth)acrylate; (meth)acrylic acid; (meth)acrylonitrile; (meth)acrylamides such as (meth)acrylamide, N-dimethyl(meth)acrylamide, N-diethyl(meth)acrylamide, N-butyl(meth)acrylamide, dimethylaminopropyl(meth)acrylamide, N-methylol(meth)acrylamide, N-methoxymethyl(meth)acrylamide, N-butoxymethyl(meth)acrylamide, (meth)acryloylmorpholine, hydroxyethyl(meth)acrylamide, and methylene bis(meth)acrylamide; epoxy(meth)acrylates such as a compound resulting from reaction of (meth)acrylic acid or derivatives thereof with a bisphenol type epoxy resin obtained by condensation reaction between bisphenols (bisphenol A, bisphenol F, bisphenol S, tetrabromo bisphenol A, and the like) and epichlorohydrin; aromatic vinyls such as styrene and α-methyl styrene; vinyl ethers such as vinyl methyl ether, vinyl ethyl ether, and 2-hydroxyethyl vinyl ether; vinyl carboxylates such as vinyl acetate and vinyl butyrate; and olefins such as ethylene, propylene, butene, and isobutene. These polymerizable monomers (A) may be used alone or in combination of two or more kinds thereof. Among these polymerizable monomers (A), from the viewpoint of having excellent handlability and an excellent curing property of the active energy ray curable composition and having various excellent physical properties of the light extraction film 10 for EL such as flexibility, heat resistance, abrasion resistance, solvent resistance, and a light transmitting property, (meth)acrylates, epoxy(meth)acrylates, aromatic vinyls, and olefins are preferable, and (meth)acrylates and epoxy(meth)acrylates are more preferable.

In the present specification, (meth)acrylate indicates acrylate or methacrylate.

The content ratio of the polymerizable monomer (A) in the active energy ray curable composition to the total mass of the active energy ray curable composition is preferably 0.5% by mass to 60% by mass, more preferably 1% by mass to 57% by mass, and even more preferably 2% by mass to 55% by mass. When the content ratio of the polymerizable monomer (A) to the total mass of the active energy ray curable composition is 0.5% by mass or more, the handlability of the active energy ray curable composition is excellent. Furthermore, when the content ratio of the polymerizable monomer (A) to the total mass of the active energy ray curable composition is 60% by mass or less, the cross-linking property or the curing property of the active energy ray curable composition is excellent and the solvent resistance of the light extraction film 10 for EL is excellent.

Examples of the cross-linkable monomer (B) include hexa(meth)acrylates such as dipentaerythritol hexa(meth)acrylate and caprolactone-modified dipentaerythritol hexa(meth)acrylate; penta(meth)acrylates such as dipentaerythritol hydroxy penta(meth)acrylate and caprolactone-modified dipentaerythritol hydroxy penta(meth)acrylate; tetra(meth)acrylates such as ditrimethylolpropane tetra(meth)acrylate, pentaerythritol tetra(meth)acrylate, pentaerythritol ethoxy-modified tetra(meth)acrylate, dipentaerythtol hexa(meth)acrylate, dipentaerythtol penta(meth)acrylate, and tetramethylolmethane tetra(meth)acrylate; tri(meth)acrylates such as trimethylol propane tri(meth)acrylate, trisethoxylated trimethylol propane tri(meth)acrylate, pentaerythritol tri(meth)acrylate, ethoxylated pentaerythritol tri(meth)acrylate, tris(2-(meth)acryloyloxyethyl)isocyanurate, trimethylol propane tri(meth)acrylate modified with aliphatic hydrocarbon with 2 to 5 carbon atoms, and isocyanuric acid ethylene oxide-modified tri(meth)acrylate; di(meth)acrylates such as triethylene glycol di(meth)acrylate, diethylene glycol di(meth)acrylate, 1,3-butylene glycol di(meth)acrylate, 1,4-butanediol di(meth)acrylate, 1,5-pentanediol di(meth)acrylate, 1,6-hexanediol di(meth)acrylate, nonane diol di(meth)acrylate, neopentyl glycol di(meth)acrylate, methylpentanediol di(meth)acrylate, diethylpentanediol di(meth)acrylate, hydroxypyvalic acid neopentyl glycol di(meth)acrylate, tetraethylene glycol di(meth)acrylate, tripropylene glycol di(meth)acrylate, polybutylene glycol di(meth)acrylate, tricyclodecane dimethanol di(meth)acrylate, 2,2-bis(4-(meth)acryloxypolyethoxyphenyl)propane, 2,2-bis(4-(meth)acryloxyethoxyphenyl)propane, 2,2-bis(4-(3-(meth)acryloxy-2-hydroxypropoxy)phenyl)propane, 1,2-bis(3-(meth)acryloxy-2-hydroxypropoxy)ethane, 1,4-bis(3-(meth)acryloxy-2-hydroxypropoxy)butane, bis(2-(meth)acryloyloxyethyl)-2-hydroxyethylisocyanurate, cyclohexane dimethanol di(meth)acrylate, dimethylol tricyclodecane di(meth)acrylate, hydroxypyvalic acid neopentyl glycol di(meth)acrylate, polyethoxylated cyclohexane dimethanol di(meth)acrylate, polypropoxylated cyclohexane dimethanol di(meth)acrylate, polyethoxylated bisphenol A di(meth)acrylate, polypropoxylated bisphenol A di(meth)acrylate, hydrogenated bisphenol A di(meth)acrylate, polyethoxylated hydrogenated bisphenol A di(meth)acrylate, polypropoxylated hydrogenated bisphenol A di(meth)acrylate, bisphenoxyfluorene ethanol di(meth)acrylate, neopentyl glycol-modified trimethylol propane di(meth)acrylate, di(meth)acrylate of ε-caprolactone adduct of hydroxypyvalic acid neopentyl glycol, di(meth)acrylate of γ-butyrolactone adduct of hydroxypyvalic acid neopentyl glycol, di(meth)acrylate of caprolactone adduct of neopentyl glycol, di(meth)acrylate of caprolactone adduct of butylene glycol, di(meth)acrylate of caprolactone adduct of cyclohexane dimethanol, di(meth)acrylate of caprolactone adduct of dicyclopentanediol, di(meth)acrylate of ethylene oxide adduct of bisphenol A, di(meth)acrylate of propylene oxide adduct of bisphenol A, di(meth)acrylate of caprolactone adduct of bisphenol A, di(meth)acrylate of caprolactone adduct of hydrogenated bisphenol A, di(meth)acrylate of caprolactone adduct of bisphenol F, and isocyanuric acid ethylene oxide-modified di(meth)acrylate; diallyls such as diallylphthalate, diallylterephthalate, diallylisophthalate, and diethylene glycol diallylcarbonate; allyl(meth)acrylate; divinyl benzene; methylene bisacrylamide; polyester polyfunctional (meth)acrylates such as a compound obtained by a reaction between polybasic acid (phthalic acid, succinic acid, hexahydrophthalic acid, tetrahydrophthalic acid, terephthalic acid, azelaic acid, adipic acid, or the like), polyhydric alcohol (ethylene glycol, hexanediol, polyethylene glycol, polytetramethylene glycol, or the like), and (meth)acrylic acid or derivatives thereof; urethane polyfunctional (meth)acrylates such as a compound obtained by a reaction between a diisocyanate compound (tolylene diisocyanate, isophorone diisocyanate, xylene diisocyanate, dicyclohexylmethane diisocyanate, hexamethylene diisocyanate, or the like) and a hydroxyl group-containing (meth)acrylate (2-hydroxyethyl(meth)acrylate, 2-hydroxypropyl(meth)acrylate, 4-hydroxybutyl(meth)acrylate, pentaerythritol tri(meth)acrylate, or the like) and a compound obtained by reacting a hydroxyl group-containing (meth)acrylate with an isocyanate group which has been left after adding a diisocyanate compound to a hydroxyl group of alcohols (one or two or more types of alkane diol, polyether diol, polyester diol, and a spiroglycol compound); divinyl ethers such as diethylene glycol divinyl ether and triethylene glycol divinyl ether; and dienes such as butadiene, isoprene, and dimethyl butadiene. These cross-linkable monomers (B) may be used alone or in combination of two or more kinds thereof. Among these cross-linkable monomers (B), from the viewpoint of having various excellent physical properties of the optical film 10 such as flexibility, heat resistance, abrasion resistance, solvent resistance, and a light transmitting property, hexa(meth)acrylates, penta(meth)acrylates, tetra(meth)acrylates, tri(meth)acrylates, di(meth)acrylates, diallyls, allyl(meth)acrylate, polyester polyfunctional (meth)acrylates, and urethane polyfunctional (meth)acrylates are preferable, and hexa(meth)acrylates, penta(meth)acrylates, tetra(meth)acrylates, tri(meth)acrylates, di(meth)acrylates, polyester di(meth)acrylates, and urethane polyfunctional (meth)acrylates are more preferable.

The content ratio of the cross-linkable monomer (B) in the active energy ray curable composition to the total mass of the active energy ray curable composition is preferably 30% by mass to 98% by mass, more preferably 35% by mass to 97% by mass, and even more preferably 40% by mass to 96% by mass. When the content ratio of the cross-linkable monomer (B) to the total mass of the active energy ray curable composition is 30% by mass or more, the cross-linking property or the curing property of the active energy ray curable composition is excellent and the solvent resistance of the light extraction film 10 for EL is excellent. Furthermore, when the content ratio of the cross-linkable monomer (B) to the total mass of the active energy ray curable composition is 98% by mass or less, the flexibility of the light extraction film 10 for EL is excellent.

Examples of the polymerization initiator (C) include carbonyl compounds such as benzoin, benzoin methyl ether, benzoin ethyl ether, benzoin isopropyl ether, benzoin isobutyl ether, acetoin, benzyl, benzophenone, p-methoxybenzophenone, 2,2-diethoxyacetophenone, α,α-dimethoxy-α-phenylacetophenone, benzyl dimethyl ketal, methylphenyl glyoxylate, ethylphenyl glyoxylate, 4,4'-bis(dimethylamino) benzophenone, 1-hydroxycyclohexyl phenyl ketone, 2-hydroxy-2-methyl-1-phenylpropan-1-one, and 2-ethyl anthraquinone; sulfur compounds such as tetramethylthiuram monosulfide and tetramethylthiuram disulfide; and acyl phosphine oxides such as 2,4,6-trimethylbenzoyl diphenylphosphine oxide and benzoyldiethoxy phosphine oxide. These polymerization initiators (C) may be used alone or in combination of two or more kinds thereof. Among these polymerization initiators (C), from the viewpoint of having excellent handlability or an excellent curing property of an active energy ray curable composition and an excellent light transmitting property of the light extraction film 10 for EL, carbonyl compounds and acyl phosphine oxides are preferable, and carbonyl compounds are more preferable.

The content ratio of the polymerization initiator (C) in the active energy ray curable composition to the total mass of the active energy ray curable composition is preferably 0.1% by mass to 10% by mass, more preferably 0.5% by mass to 8% by mass, and even more preferably 1% by mass to 5% by mass. When the content ratio of the polymerization initiator (C) to the total mass of the active energy ray curable composition is 0.1% by mass or more, the handlability or the curing property of the active energy ray curable composition is excellent. Furthermore, when the content ratio of the polymerization initiator (C) to the total mass of the active energy ray curable composition is 10% by mass or less, the light transmitting property of the light extraction film 10 for EL is excellent.

From the viewpoint of having excellent light extraction efficiency of the surface light-emitting body, the refractive index of the second resin is preferably 1.40 to 1.80, more preferably 1.43 to 1.75, and even more preferably 1.46 to 1.72. In particular, in a case where a surface light-emitting body with excellent luminance in the normal direction is desired to be obtained, the refractive index of the second resin is preferably 1.55 to 1.80, more preferably 1.56 to 1.75, and even more preferably 1.57 to 1.72.

From the viewpoint of having an excellent light transmitting property of the light extraction film 10 for EL and excellent light extraction efficiency of the surface light-emitting body, the content ratio of the second resin to the total mass of the recessed and projected structure layer 11 is preferably 80% by mass or more, more preferably 80% by mass to 100% by mass, and even more preferably 90% by mass to 100% by mass.

The recessed and projected structure layer 11 may contain other components to the extent that the performance of the light extraction film 10 for EL is not impaired, in addition to the second resin.

Examples of the other components in the recessed and projected structure layer 11 include a light-diffusion fine particle, a release agent, a flame retardant, an antistatic agent, a leveling agent, an anti-fouling performance enhancer, a dispersion stabilizer, and a viscosity modifier.

Incidentally, in the present specification, light-diffusion fine particles included in the recessed and projected structure layer 11 are referred to as second light-diffusion fine particles.

From the viewpoint of suppressing a decrease in performance of the light extraction film 10 for EL, the content ratio of the other components other than the second light-diffusion fine particles to the total mass of the recessed and projected structure layer 11 is preferably 10% by mass or less, more preferably 0% by mass to 10% by mass, and even more preferably 1% by mass to 5% by mass.

From the viewpoint of having an excellent light transmitting property of the light extraction film 10 for EL and excellent light extraction efficiency of the surface light-emitting body, the content ratio of the second light-diffusion fine particles to the total mass of the recessed and projected structure layer 11 is preferably 20% by mass or less, more preferably 0% by mass to 20% by mass, and even more preferably 0% by mass to 10% by mass, and particularly preferably, the recessed and projected structure layer 11 does not substantially include the second light-diffusion fine particles. Here, the expression "not substantially include" indicates a case where the content ratio is equal to or less than a content ratio almost not to influence or change the function of the light extraction film 10 for EL or the surface light-emitting body.

Examples of the material, the refractive index, the volume average particle diameter, and the shape of the second light-diffusion fine particles in the recessed and projected structure layer 11 include the same as the material, the refractive index, the volume average particle diameter, and the shape of light-diffusion fine particles in the diffusion layer 12 to be described later (in the present specification, the light-diffusion fine particles included in the diffusion layer 12 are referred to as first light-diffusion fine particles), and preferable ranges and reasons therefor are also the same as those of the first light-diffusion fine particles.

Examples of a difference in refractive index between the resin and the second light-diffusion fine particles and the combination of the resin and the second light-diffusion fine particles in the recessed and projected structure layer 11 include the same as the refractive index between the resin and the first light-diffusion fine particles and the combination of the resin and the first light-diffusion fine particles in the diffusion layer 12 to be described later, and preferable ranges and reasons therefor are also the same as those in the diffusion layer 12.

The first light-diffusion fine particles and the second light-diffusion fine particles may be the same as or different from each other.

(Intermediate Layer 13)

In order to support the recessed and projected structure 14 of the recessed and projected structure layer 11 or bring the recessed and projected structure layer 11 into close contact with the diffusion layer 12, the intermediate layer 13 may be provided between the recessed and projected structure layer 11 and the diffusion layer 12.

From the viewpoint of having excellent productivity of the light extraction film 10 for EL, the material of the intermediate layer 13 is preferably the same composition as in the recessed and projected structure layer 11. In a case where the intermediate layer 13 and the recessed and projected structure layer 11 are formed by the same material, the intermediate layer 13 and the recessed and projected structure layer 11 may be collectively called a surface layer 23 in some cases.

(Diffusion Layer 12)

The diffusion layer 12 is formed by a material containing the first light-diffusion fine particles. The content of the first light-diffusion fine particles relative to the total mass of the material of the diffusion layer 12 is preferably 10% by mass or more, more preferably 10% by mass to 50% by mass, and even more preferably 15% by mass to 45% by mass. When the content ratio of the first light-diffusion fine particles to the total mass of the diffusion layer 12 is 10% by mass or more, it is possible to suppress the emission angle dependence of the wavelength of light emitted from the surface light-emitting body. Furthermore, when the content ratio of the first light-diffusion fine particles to the total mass of the diffusion layer 12 is 50% by mass or less, the light transmitting property of the light extraction film 10 for EL is excellent and the light extraction efficiency of the surface light-emitting body is excellent.

The material of the diffusion layer 12 is not particularly limited as long as it is a material with a high light transmittance in the wavelength range of visible light (about 400 nm to 700 nm). Specifically, regarding the visible light transmittance of the material of the recessed and projected structure layer 11, a value measured in conformity with ISO 13468 is preferably 50% or more and more preferably 50% to 100%. For example, glass containing 10% by mass or more of the first light-diffusion fine particles, a resin containing 10% by mass or more of the first light-diffusion fine particles, and the like are exemplified. Among these materials of the diffusion layer 12, from the viewpoint of having excellent productivity of the light extraction film 10 for EL, a resin is preferable. As the diffusion layer 12, a commercially available diffusion sheet may be used without any change. In the present specification, a resin that is the material of the diffusion layer 12 is referred to as a first resin.

Examples of the type of the first resin, and a monomer as a raw material and the compositional ratio thereof in the diffusion layer 12 include the same as the type of the second resin, and the same monomer as a raw material and the same compositional ratio thereof in the recessed and projected structure layer 11 described above, and preferable ranges and reasons therefor are also the same as those in the recessed and projected structure layer 11.

The first resin and the second resin may be the same as or different from each other.

The content ratio of the first resin to the total mass of the diffusion layer 12 is preferably 50 mass or more, more preferably 50% by mass to 90% by mass or more, and even more preferably 55% by mass to 85% by mass. When the content ratio of the first resin to the total mass of the diffusion layer 12 is 50% by mass or more, the light transmitting property of the light extraction film 10 for EL is excellent and the light extraction efficiency of the surface light-emitting body is excellent. Furthermore, when the content ratio of the first resin to the total mass of the diffusion layer 12 is 90% by mass or less, it is possible to suppress the emission angle dependence of the wavelength of light emitted from the surface light-emitting body.

(First Light-Diffusion Fine Particles)

The first light-diffusion fine particles in the diffusion layer 12 are not particularly limited as long as they are light-diffusion fine particles having a light diffusion property in the wavelength range of visible light (about 400 nm to 700 nm) and known light-diffusion fine particles can be used. The first light-diffusion fine particles in the diffusion layer 12 may be used alone or in combination of two or more kinds thereof.

The first light-diffusion fine particles may be evenly dispersed in the first resin. A case where the first light-diffusion fine particles are evenly dispersed in the first resin may be a case where the first light-diffusion fine particles are substantially evenly dispersed in the first resin. Here, the expression "the first light-diffusion fine particles are substantially evenly dispersed in the first resin" is defined as a case where errors of the content ratios (% by mass) of the first light-diffusion fine particles in the cross section of 100 $\mu m^2$ at arbitrary five positions are all within 10% based on the content ratio (% by mass) of the first light-diffusion fine particles in the cross section of 1 $mm^2$ in the diffusion layer 12.

Examples of a material of the first light-diffusion fine particles in the diffusion layer 12 include metals such as gold, silver, silicon, aluminum, magnesium, zirconium, titanium, zinc, germanium, indium, tin, antimony, and cerium; metal oxides such as silicon oxide, aluminum oxide, magnesium oxide, zirconium oxide, titanium oxide, zinc oxide, germanium oxide, indium oxide, tin oxide, indium tin oxide, antimony oxide, and cerium oxide; metal hydroxides such as aluminum hydroxide; metal carbonates such as magnesium carbonate; metal nitrides such as silicon nitride; and resins such as an acrylic resin, a styrene resin, a silicone resin, a urethane resin, a melamine resin, and an epoxy resin. These materials of the first light-diffusion fine particles in the diffusion layer 12 may be used alone or in combination of two or more kinds thereof. Among these materials of the first light-diffusion fine particles in the diffusion layer 12, from the viewpoint of excellent handlability at the time of producing the light extraction film 10 for EL, silicon, aluminum, magnesium, silicon oxide, aluminum oxide, magnesium oxide, aluminum hydroxide, magnesium carbonate, an acrylic resin, a styrene resin, a silicone resin, a urethane resin, a melamine resin, and an epoxy resin are preferable, and particles of silicon oxide, aluminum oxide, aluminum hydroxide, magnesium carbonate, an acrylic resin, a styrene resin, a silicone resin, a urethane resin, a melamine resin, and an epoxy resin are more preferable.

From the viewpoint of having excellent light extraction efficiency of the surface light-emitting body, the refractive index of the first light-diffusion fine particles in the diffusion layer 12 is preferably 1.30 to 2.00, more preferably 1.35 to 1.95, and even more preferably 1.40 to 1.90.

The volume average particle diameter of the first light-diffusion fine particles in the diffusion layer 12 is preferably 0.5 µm to 20 µm, more preferably 0.8 µm to 15 µm, and even more preferably 1 µm to 10 µm. When the volume average particle diameter of the first light-diffusion fine particles in the diffusion layer 12 is 0.5 µm or more, light in visible wavelength range can be effectively scattered. Furthermore, when the volume average particle diameter of the first light-diffusion fine particles in the diffusion layer 12 is 20 µm or less, it is possible to suppress the emission angle dependence of the wavelength of light emitted from the surface light-emitting body.

Examples of the shape of the first light-diffusion fine particles in the diffusion layer 12 include a spherical shape, a column shape, a cubic shape, a rectangular shape, a pyramid shape, a cone shape, a star shape, and an amorphous shape. These shapes of the first light-diffusion fine particles in the diffusion layer 12 may be used alone or in combination of two or more kinds thereof. Among these shapes of the first light-diffusion fine particles in the diffusion layer 12, from the viewpoint that light in visible wavelength range can be effectively scattered, a spherical shape, a cubic shape, a rectangular shape, a pyramid shape, and a star shape are preferable, and a spherical shape is more preferable.

When there is a difference in refractive index between the first resin and the first light-diffusion fine particles in the diffusion layer 12, a light diffusion effect of the first light-diffusion fine particles is exerted. When the refractive index of the first resin is designated as Rxm and the refractive index of the first light-diffusion fine particles is designated as Rxp, from the viewpoint of having excellent light extraction efficiency of the surface light-emitting body, a difference between the refractive index Rxm of the first resin and the refractive index Rxp of the first light-diffusion fine particles is preferably 0.05 to 0.30, more preferably 0.06 to 0.25, and even more preferably 0.07 to 0.23. In particular, in a case where the surface light-emitting body with excellent luminance in the normal direction is desired to be obtained, the refractive index Rxm of the first resin and the refractive index Rxp of the first light-diffusion fine particles are preferably 0.15 to 0.30, more preferably 0.16 to 0.28, and even more preferably 0.17 to 0.25.

Examples of the combination of the first resin and the first light-diffusion fine particles in the diffusion layer 12 include a combination in which the first resin is an acrylic resin and the first light-diffusion fine particles are silicon fine particles, a combination in which the first resin is an acrylic resin and the first light-diffusion fine particles are aluminum fine particles, a combination in which the first resin is an acrylic resin and the first light-diffusion fine particles are magnesium fine particles, a combination in which the first resin is an acrylic resin and the first light-diffusion fine particles are silicon oxide fine particles, a combination in which the first resin is an acrylic resin and the first light-diffusion fine particles are aluminum oxide fine particles, a combination in which the first resin is an acrylic resin and the first light-diffusion fine particles are magnesium oxide fine particles, a combination in which the first resin is an acrylic resin and the first light-diffusion fine particles are aluminum hydroxide fine particles, a combination in which the first resin is an acrylic resin and the first light-diffusion fine particles are magnesium carbonate fine particles, a combination in which the first resin is an acrylic resin and the first light-diffusion fine particles are acrylic resin fine particles, a combination in which the first resin is an acrylic resin and the first light-diffusion fine particles are styrene resin fine particles, a combination in which the first resin is an acrylic resin and the first light-diffusion fine particles are silicone resin fine particles, a combination in which the first resin is an acrylic resin and the first light-diffusion fine particles are urethane resin fine particles, a combination in which the first resin is an acrylic resin and the first light-diffusion fine particles are melamine resin fine particles, a combination in which the first resin is an acrylic resin and the first light-diffusion fine particles are epoxy resin fine particles, a combination in which the first resin is a polycarbonate resin and the first light-diffusion fine particles are silicon fine particles, a combination in which the first resin is a polycarbonate resin and the first light-diffusion fine particles are aluminum fine particles, a combination in which the first resin is a polycarbonate resin and the first light-diffusion fine particles are magnesium fine particles, a combination in which the first resin is a polycarbonate resin and the first light-diffusion fine particles are silicon oxide fine particles, a combination in which the first resin is a polycarbonate resin and the first light-diffusion fine particles are aluminum oxide fine particles, a combination in which the first resin is a polycarbonate resin and the first light-diffusion fine particles are magnesium oxide fine particles, a combination in which the first resin is a polycarbonate resin and the first light-diffusion fine particles are aluminum hydroxide fine particles, a combination in which the first resin is a polycarbonate resin and the first light-diffusion fine particles are magnesium carbonate fine particles, a combination in which the first resin is a polycarbonate resin and the first light-diffusion fine particles are acrylic resin fine particles, a combination in which the first resin is a polycarbonate resin and the first light-diffusion fine particles are styrene resin fine particles, a combination in which the first resin is a polycarbonate resin and the first light-diffusion fine particles are silicone resin fine particles, a combination in which the first resin is a polycarbonate resin and the first light-diffusion fine particles are urethane resin fine particles, a combination in which the first resin is a polycarbonate resin and the first light-diffusion fine particles are melamine resin fine particles, a combination in which the first resin is a polycarbonate resin and the first light-diffusion fine particles are epoxy resin fine particles, a combination in which the first resin is polyethylene terephthalate and the first light-diffusion fine particles are silicon fine particles, a combination in which the first resin is polyethylene terephthalate and the first light-diffusion fine particles are aluminum fine particles, a combination in which the first resin is polyethylene terephthalate and the first light-diffusion fine particles are magnesium fine particles, a combination in which the first resin is polyethylene terephthalate and the first light-diffusion fine particles are silicon oxide fine particles, a combination in which the first resin is polyethylene terephthalate and the first light-diffusion fine particles are aluminum oxide fine particles, a combination in which the first resin is polyethylene terephthalate and the first light-diffusion fine particles are magnesium oxide fine particles, a combination in which the first resin is polyethylene terephthalate and the light-diffusion fine particles are aluminum hydroxide fine particles, a combination in which the first resin is polyethylene terephthalate and the first light-diffusion fine particles are magnesium carbonate fine particles, a combination in which the first resin is polyethylene terephthalate and the first light-diffusion fine particles are acrylic resin fine particles, a combination in which the first resin is polyethylene terephthalate and the first light-diffusion fine particles are styrene resin fine particles, a combination in which the first resin is polyethylene terephthalate and the first light-diffusion fine particles are silicone resin fine particles, a combination in which the first resin is polyethylene terephthalate and the first light-diffusion fine particles are urethane resin fine particles, a combination in which the first resin is polyethylene terephthalate and the first light-diffusion fine particles are melamine resin fine particles, and a combination in which the first resin is polyethylene terephthalate and the first light-diffusion fine particles are epoxy resin fine particles. Among the combinations of the first resin and the first light-diffusion fine particles in the diffusion layer 12, from the viewpoint of having excellent heat resistance, dynamic properties, and molding processability of the light extraction film 10 for EL, the viewpoint that the refractive index difference is in the preferable range described above, and the viewpoint of having excellent light extraction efficiency of the surface light-emitting body, a combination in which the first resin is an acrylic resin and the first light-diffusion fine particles are silicon fine particles, a combination in which the first resin is an acrylic resin and the first light-diffusion fine particles are aluminum fine particles, a combination in which the first resin is an acrylic resin and the first light-diffusion fine particles are magnesium fine particles, a combination in which the first resin is an acrylic resin and the first light-diffusion fine particles are silicon oxide fine particles, a combination in which the first resin is an acrylic resin and the first light-diffusion fine particles are aluminum oxide fine particles, a combination in which the first resin is an acrylic resin and the first light-diffusion fine particles are magnesium oxide fine particles, a combination in which the first resin is an acrylic resin and the first light-diffusion fine particles are aluminum hydroxide fine particles, a combination in which the first resin is an acrylic resin and the first light-diffusion fine particles are magnesium carbonate fine particles, a combination in which the first resin is an acrylic resin and the first light-diffusion fine particles are acrylic resin fine particles, a combination in which the first resin is an acrylic resin and the first light-diffusion fine particles are styrene resin fine particles, a combination in which the first resin is an acrylic resin and the first light-diffusion fine particles are silicone resin fine particles, a combination in which the first resin is an acrylic resin and the first light-diffusion fine particles are urethane resin fine particles, a combination in which the first resin is an acrylic resin and the first light-diffusion fine particles are melamine resin fine particles, and a combination in which the first resin is an acrylic resin and the first light-diffusion fine particles are epoxy resin fine particles are preferable, and a combination in which the first resin is an acrylic resin and the first light-diffusion fine particles are silicon oxide fine particles, a combination in which the resin is an acrylic resin and the light-diffusion fine particles are aluminum oxide fine particles, a combination in which the first resin is an acrylic resin and the first light-diffusion fine particles are aluminum hydroxide fine particles, a combination in which the first resin is an acrylic resin and the first light-diffusion fine particles are magnesium carbonate fine particles, a combination in which the first resin is an acrylic resin and the first light-diffusion fine particles are acrylic resin fine particles, a combination in which the first resin is an acrylic resin and the first light-diffusion fine particles are styrene resin fine particles, a combination in which the first resin is an acrylic resin and the first light-diffusion fine particles are silicone resin fine particles, a combination in which the first resin is an acrylic resin and the first light-diffusion fine particles are urethane resin fine particles, a combination in which the first resin is an acrylic resin and the first light-diffusion fine particles are melamine resin fine particles, and a combination in which the first resin is an acrylic resin and the first light-diffusion fine particles are epoxy resin fine particles are more preferable.

The content ratio of the first light-diffusion fine particles in the diffusion layer 12 to the total mass of the diffusion layer 12 is preferably 10% by mass to 50% by mass, more preferably 12% by mass to 45% by mass or more, and even more preferably 15% by mass to 40% by mass. When the content ratio of the first light-diffusion fine particles in the diffusion layer 12 is 10% by mass or more, it is possible to suppress the emission angle dependence of the wavelength of light emitted from the surface light-emitting body. Furthermore, when the content ratio of the first light-diffusion fine particles in the diffusion layer 12 is 50% by mass or less, the light transmitting property of the light extraction film 10 for EL is excellent and the light extraction efficiency of the surface light-emitting body is excellent.

When the content ratio of the first light-diffusion fine particles to the total mass of the diffusion layer 12 is designated as Px and the content ratio of the second light-diffusion fine particles to the total mass of the recessed and projected structure layer 11 is designated as Py, the content ratio Px of the first light-diffusion fine particles and the content ratio Py of the second light-diffusion fine particles satisfy the following Expression (1).

$$Px-Py \geq 5\% \text{ by mass} \qquad (1)$$

When a light extraction film for EL in which the content ratio Px of the first light-diffusion fine particles and the content ratio Py of the second light-diffusion fine particles satisfy Expression (1) is used in the surface light-emitting body, the light extraction efficiency and the luminance in the normal direction are excellent and it is possible to suppress the emission angle dependence of the wavelength of emitted light.

As another aspect of the invention, it is preferable that the content ratio Px of the first light-diffusion fine particles and the content ratio Py of the second light-diffusion fine particles satisfy the following Expression (2).

$$5\% \text{ by mass} \leq Px-Py \leq 50\% \text{ by mass} \qquad (2)$$

When a light extraction film for EL in which the content ratio Px of the first light-diffusion fine particles and the content ratio Py of the second light-diffusion fine particles satisfy Expression (2) is used in the surface light-emitting body, the light extraction efficiency and the luminance in the normal direction are excellent and it is possible to suppress the emission angle dependence of the wavelength of emitted light.

From the viewpoint of having excellent light extraction efficiency and luminance in the normal direction of the surface light-emitting body and the viewpoint that it is possible to suppress the emission angle dependence of the wavelength of light emitted from the surface light-emitting body, the lower limit value in Expression (2) is preferably 5% by mass and more preferably 10% by mass. Similarly, from the viewpoint of having excellent light extraction efficiency and luminance in the normal direction of the surface light-emitting body and the viewpoint that it is possible to suppress the emission angle dependence of the wavelength of light emitted from the surface light-emitting body, the upper limit value in Expression (2) is preferably 50% by mass and more preferably 40% by mass.

The diffusion layer 12 may contain other components to the extent that the performance of the light extraction film 10 for EL is not impaired, in addition to the first resin and the first light-diffusion fine particles.

Examples of the other components include a release agent, a flame retardant, an antistatic agent, a leveling agent, an anti-fouling performance enhancer, a dispersion stabilizer, and a viscosity modifier.

From the viewpoint of suppressing a decrease in performance of the light extraction film 10 for EL, the content ratio of the other components in the diffusion layer 12 to the total mass of the diffusion layer 12 is preferably 10% by mass or less, more preferably 0% by mass to 10% by mass, and even more preferably 1% by mass or less to 5% by mass.

The thickness of the diffusion layer 12 is preferably 1 μm to 50 μm, more preferably 2 μm to 40 μm, and even more preferably 3 μm to 30 μm. When the thickness of the diffusion layer 12 is 1 μm or more, it is possible to suppress the emission angle dependence of the wavelength of light emitted from the surface light-emitting body. Furthermore, when the thickness of the diffusion layer 12 is 50 μm or less, the light transmitting property of the light extraction film 10 for EL is excellent and the light extraction efficiency of the surface light-emitting body is excellent.

Here, the thickness of the diffusion layer 12 is calculated as follows. A cross section of the light extraction film 10 for EL is photographed by an electronic microscope, the dimension from the bottom surface portion of the diffusion layer 12 to the highest portion of the diffusion layer 12 is measured at arbitrary five positions, and an average value of the values thus measured is obtained.

In order to protect the recessed and projected structure 14 and enhance the handlability of the light extraction film 10 for EL, a protective film may be provided on the surface, which has the recessed and projected structure 14, of the light extraction film 10 for EL of the invention. The protective film may be removed at the time of using the light extraction film for EL.

As the protective film, for example, a known protective film or the like is exemplified.

(Base Material 16)

In order to maintain the shape of the light extraction film 10 for EL, the base material 16 may be provided on the surface of the diffusion layer 12 in the light extraction film 10 for EL of the invention.

From the viewpoint of having an excellent curing property of an active energy ray curable composition, a base material allowing transmission of the active energy ray is preferable as the base material 16.

Examples of a material of the base material 16 include acrylic resins; polycarbonate resins; polyester resins such as polyethylene terephthalate, polybutylene terephthalate, and polyethylene naphthalate; styrene resins such as polystyrene and an ABS resin; vinyl chloride resins; cellulose resins such as diacetyl cellulose and triacetyl cellulose; imide resins such as polyimide and polyimideamide; and glass. Among these materials of the base material 16, from the viewpoint of having excellent flexibility and an excellent light transmitting property for an active energy ray, acrylic resins, polycarbonate resins, polyester resins, styrene resins, cellulose resins, and imide resins are preferable, and acrylic resins, polycarbonate resins, polyester resins, and imide resins are more preferable.

From the viewpoint of having an excellent curing property of an active energy ray curable composition, the thickness of the base material 16 is preferably 10 μm to 1000 μm, more preferably 20 μm to 500 μm, and even more preferably 25 μm to 300 μm.

Here, the thickness of the base material 16 is calculated as follows. A cross section of the light extraction film 10 for EL is photographed by an electronic microscope, the dimension from the bottom surface portion of the base material 16 to the highest portion of the base material 16 is measured at arbitrary five positions, and an average value of the values thus measured is obtained.

Regarding the base material 16, in order to improve the adhesiveness between the diffusion layer 12 and the base material 16, adhesion facilitating treatment may be performed on the surface of the base material 16 as necessary.

Examples of a method for the adhesion facilitating treatment include a method of forming an easy adhesion layer consisting of a polyester resin, an acrylic resin, a urethane resin, or the like on the surface of the base material 16 and a method of roughening the surface of the base material 16.

In addition to the adhesion facilitating treatment, surface treatment of the base material 16 such as anti-static, anti-reflection, or anti-adhesion between base materials may be performed as necessary.

An adhesive layer 21 for adhering to an EL light-emitting element 30 may be provided on the surface at the side not having the recessed and projected structure 14 of the light extraction film 10 for EL of the invention. When the light extraction film 10 for EL includes the base material 16, the adhesive layer 21 may be provided on the surface of the base material 16 as illustrated in FIG. 1.

As the adhesive layer 21, for example, a known adhesive or the like is exemplified.

In order to enhance the handlability of the light extraction film 10 for EL, a protective film 22 may be provided on the surface of the adhesive layer 21 as illustrated in FIG. 1. The protective film 22 may be removed at the time of attaching the light extraction film 10 for EL or the like to the surface of the EL light-emitting element 30.

(Method for Producing Light Extraction Film 10 for EL)

As the method for producing the light extraction film 10 for EL of the invention, for example, a producing method is exemplified in which an active energy ray curable composition as a raw material of a resin for the recessed and projected structure layer 11 is supplied to an outer peripheral surface of a roll mold having the outer peripheral surface on which a plurality of transferring portions having an inverted structure of the recessed and projected structure 14 are arranged while the roll mold is rotated and the diffusion sheet having the diffusion layer 12 is allowed to travel in a rotational direction of the roll mold along the outer peripheral surface of the roll mold, a region between the outer peripheral surface of the roll mold and the diffusion sheet is irradiated with an active energy ray in a state where the active energy ray curable composition is interposed between the outer peripheral surface of the roll mold and the diffusion sheet, and thus the recessed and projected structure layer 11 is formed.

Incidentally, the entire diffusion sheet functions as the diffusion layer 12 described above.

As a method for producing a diffusion sheet, for example, a producing method of coating a mixture of an active energy ray curable composition that is a raw material of the diffusion layer 12 and light-diffusion fine particles on the base material 16 and irradiating the mixture with an active energy ray, or the like is exemplified.

Examples of a source for emitting the active energy ray include a chemical lamp, a low pressure mercury lamp, a high pressure mercury lamp, a metal halide lamp, an electrodeless ultraviolet lamp, a visible light halogen lamp, and a xenon lamp.

The accumulated light quantity of the active energy ray may be appropriately set according to the type of an active energy ray curable composition to be used, but from the viewpoint of having an excellent curing property of an active energy ray curable composition and suppressing the deterioration of the light extraction film 10 for EL, the accumulated light quantity is preferably 0.01 J/cm$^2$ to 10 J/cm$^2$ and more preferably 0.5 J/cm$^2$ to 8 J/cm$^2$.

Incidentally, the light extraction film 10 for EL may be formed by forming the recessed and projected structure layer 11 and then removing the base material 16.

(Surface Light-Emitting Body)

The surface light-emitting body of the invention includes the light extraction film 10 for EL of the invention.

As the surface light-emitting body of the invention, for example, a surface light-emitting body as illustrated in FIG. 5 is exemplified.

Hereinafter, the surface light-emitting body of the invention illustrated in FIG. 5 will be described, but the surface light-emitting body is not limited to the surface light-emitting body illustrated in FIG. 5.

The surface light-emitting body illustrated in FIG. 5 includes an organic EL light-emitting element 30 in which a glass substrate 31, a positive electrode 32, a light emitting layer 33, and a negative electrode 34 are sequentially laminated, the adhesive layer 21, and the optical film 10. The light extraction film 10 for EL is provided on the surface opposite to the surface of the glass substrate 31 on which the organic EL light-emitting element 30 is formed, with the adhesive layer 21 interposed therebetween.

An amount of chromatic variation Δu'v' of the surface light-emitting body of the invention is preferably 0.015 or less, preferably 0 to 0.015, and more preferably 0.0005 to 0.010. Incidentally, a smaller amount of chromatic variation Δu'v' means that the emission angle dependence of the wavelength of light emitted from the surface light-emitting body is suppressed. That is, as the amount of chromatic variation Δu'v' is decreased, the viewing angle dependence of light emitted from the surface light-emitting body is decreased, and this means that a change in color is less likely to occur even when the surface light-emitting body is observed from various viewing angles.

The amount of chromatic variation Δu'v' of the surface light-emitting body is measured by the following method.

A 0.1 mm-thick light shielding sheet having a hole with a diameter of 5 mm was disposed on the surface light-emitting body. In this state, light emitted from the hole with a diameter of 5 mm of the light shielding sheet when the organic EL light-emitting element was turned on by allowing a current of 0.5 A to flow into the organic EL light-emitting element was measured for chromaticities x and y in xy color system by a luminance meter from the normal direction (0°) of the surface light-emitting body, from the direction tilted at 10° from the normal direction of the surface light-emitting body, from the direction tilted at 20° from the normal direction of the surface light-emitting body, from the direction tilted at 30° from the normal direction of the surface light-emitting body, from the direction tilted at 40° from the normal direction of the surface light-emitting body, from the direction tilted at 50° from the normal direction of the surface light-emitting body, from the direction tilted at 60° from the normal direction of the surface light-emitting body, from the direction tilted at 70° from the normal direction of the surface light-emitting body, from the direction tilted at 75° from the normal direction of the surface light-emitting body, and from the direction tilted at 80° from the normal direction of the surface light-emitting body, respectively. The obtained chromaticities x and y were converted into u' and v' of CIE1976. Values of u' at respective angles and an average value of u' were plotted on the horizontal axis and values v' at respective angles and an average value of v' were plotted on the vertical axis. Distances from the plotted points of the average values of u' and v' to the plotted points of the values of u' and v' at respective angles were calculated and a value at the longest distance was considered as the amount of chromatic variation.

From the viewpoint that a balance between improvement in light extraction efficiency and suppression of emission angle dependence of the wavelength of emitted light is achieved, the surface light-emitting body in which the light extraction film 10 for EL of the invention is provided on the organic EL light-emitting element 30 can be used for, for example, lighting devices, displays, or screens, and particularly, can be used suitably for lighting devices.

EXAMPLES

Hereinafter, the invention will be described in detail by means of Examples, but the invention is not limited to these Examples.

Incidentally, "part" and "%" in Examples indicate "part by mass" and "% by mass."

(Observation of Cross Section of Light Extraction Film for EL)

A cross section of the light extraction film for EL obtained in each of Example 1 and Comparative Example 1 was observed using an electronic microscope (model name "S-4300-SE/N," manufactured by Hitachi High-Technologies Corporation).

Incidentally, for observation of the cross section of the light extraction film for EL, the light extraction film for EL obtained in each of Example 1 and Comparative Example 1 was cut using a razor blade so as to cross the vertex of the recessed and projected structure and to be perpendicular to the bottom surface portion of the recessed and projected structure.

(Measurement of Light Extraction Efficiency)

A 0.1 mm-thick light shielding sheet having a hole with a diameter of 5 mm was disposed on each of the surface light-emitting bodies obtained in Examples, Comparative Examples, and Reference Examples, and this was disposed on a sample aperture of an integrating sphere (manufactured by Labsphere, Inc., 6 inch in size). In this state, light emitted from the hole with a diameter of 5 mm of light shielding sheet when the organic EL light-emitting element was turned on by allowing a current of 10 mA to flow into the organic EL light-emitting element was measured by a spectroscopic instrument (spectroscope: model name "PMA-12" (manufactured by Hamamatsu Photonics K.K.), software: software name "U6039-01 ver. 3.3.1 basic software for PMA") and corrected by a standard luminosity curve, and the number of photons of the surface light-emitting body was calculated.

When the number of photons of the surface light-emitting body obtained in Reference Example was considered as 100%, a ratio of the number of photons of the surface light-emitting body obtained in each of Example and Comparative Example was considered as the light extraction efficiency.

(Measurement of Amount of Chromatic Variation)

A 0.1 mm-thick light shielding sheet having a hole with a diameter of 5 mm was disposed on each of the surface light-emitting bodies obtained in Examples, Comparative Examples, and Reference Examples. In this state, light emitted from the hole with a diameter of 5 mm of the light shielding sheet when the organic EL light-emitting element was turned on by allowing a current of 0.5 A to flow into the organic EL light-emitting element was measured for chromaticities x and y in xy color system by a luminance meter (model name "BM-7," manufactured by TOPCON CORPORATION) from the normal direction (0°) of the surface light-emitting body, from the direction tilted at 10° from the normal direction of the surface light-emitting body, from the direction tilted at 20° from the normal direction of the surface light-emitting body, from the direction tilted at 30° from the normal direction of the surface light-emitting body, from the direction tilted at 40° from the normal direction of the surface light-emitting body, from the direction tilted at 50° from the normal direction of the surface light-emitting body, from the direction tilted at 60° from the normal direction of the surface light-emitting body, from the direction tilted at 70° from the normal direction of the surface light-emitting body, from the direction tilted at 75° from the normal direction of the surface light-emitting body, and from the direction tilted at 80° from the normal direction of the surface light-emitting body, respectively. The obtained chromaticities x and y were converted into u' and v' of CIE1976. Values of u' at respective angles and an average value of u' were plotted on the horizontal axis and values v' at respective angles and an average value of v' were plotted on the vertical axis. A distance from the plotted points of the average values of u' and v' to the plotted points of the values of u' and v' at respective angles was calculated and a value at the longest distance was considered as the amount of chromatic variation.

Incidentally, a smaller amount of chromatic variation means better suppression of emission angle dependence of the wavelength of light emitted from the surface light-emitting body.

(Materials)

Active energy ray curable composition A: an active energy ray curable composition produced in Production Example 1 to be described later (refractive index of a cured product: 1.52)

Active energy ray curable composition B: an active energy ray curable composition produced in Production Example 2 to be described later (refractive index of a cured product: 1.60)

Light-diffusion fine particles A: silicone resin spherical fine particles (trade name "Tospearl 120," manufactured by Momentive Performance Materials Inc., refractive index: 1.42, volume average particle diameter: 2 µm)

Organic EL light-emitting element A: an organic EL light-emitting element in which the optical film on the surface of the light emitting surface side of Symfos OLED-010K (manufactured by KONICA MINOLTA, INC., white OLED element) is removed Organic EL light-emitting element B: an organic EL light-emitting element in which the optical film on the surface of the light emitting surface side of OLE-P0909-L3 (manufactured by Pioneer OLED Lighting Devices Corporation, white OLED element) is removed Organic EL light-emitting element C: an organic EL light-emitting element in which the optical film on the surface of the light emitting surface side of the organic EL lighting module NZIP1102F (manufactured by Panasonic Corporation, white OLED element) is removed Reference Example 1

The organic EL light-emitting element A itself was used as a surface light-emitting body.

Reference Example 2

The organic EL light-emitting element B itself was used as a surface light-emitting body.

Reference Example 3

The organic EL light-emitting element C itself was used as a surface light-emitting body.

Production Example 1

(Production of Active Energy Ray Curable Composition A)

To a glass flask, 117.6 g (0.7 mol) of hexamethylene diisocyanate and 151.2 g (0.3 mol) of isocyanurate-type hexamethylene diisocyanate trimer as a diisocyanate compound, 128.7 g (0.99 mol) of 2-hydroxypropylacrylate and 693 g (1.54 mol) of pentaerythritol triacrylate as hydroxyl group-containing (meth)acrylate, 22.1 g of di-n-butyltin dilaurate as a catalyst, and 0.55 g of hydroquinone monomethyl ether as a polymerization inhibitor were added. After raising the temperature to 75° C., the stirring was continued while the temperature was maintained to 75° C., and the reaction was allowed to occur until the concentration of the isocyanate compound remaining in the flask was 0.1 mol/L or less. As a result of cooling to room temperature, urethane polyfunctional acrylate was obtained.

35 parts of the obtained urethane polyfunctional acrylate, 20 parts of polybutylene glycol dimethacrylate (trade name "Acryester PBOM," manufactured by MITSUBISHI RAYON CO., LTD.), 40 parts of ethylene oxide-modified bisphenol A dimethacrylate (trade name "New Frontier BPEM-10," manufactured by DKS Co. Ltd.), 5 parts of phenoxyethyl acrylate (trade name "New Frontier PHE," manufactured by DKS Co. Ltd.), and 1.2 parts of 1-hydroxy-cyclohexyl phenyl ketone (trade name "IRGACURE 184," manufactured by BASF) were mixed with one another to obtain an active energy ray curable composition A.

Production Example 2

(Production of Active Energy Ray Curable Composition B)

70 parts of fluorene polyfunctional acrylate (trade name "Ogsol EA-HR034"), 10 parts of polybutylene glycol dimethacrylate (trade name "Acryester PBOM," manufactured by MITSUBISHI RAYON CO., LTD.), 20 parts of ethoxylated bisphenol A diacrylate (trade name "ABE-300," manufactured by Shin Nakamura Chemical Co., Ltd.), and 1 part of 1-hydroxycyclohexyl phenyl ketone (trade name "IRGACURE 184," manufactured by BASF) were mixed with one another to obtain an active energy ray curable composition B.

Production Example 3

(Production of Flat Mold Having Hemispherical Transferring Portion of Recessed and Projected Structure)

On 100 mm-square steel flat mold, copper plating with a thickness of 200 µm and a Vickers hardness of 200 Hv was performed. The surface of the copper plating layer was coated with a sensitizer, and was subjected to laser light exposure, development, and etching, thereby obtaining a mold having a transferring portion formed therein, in which hemispherical depressions having a diameter of 50 µm and a depth of 25 µm are arranged on the copper plating layer in a hexagonal alignment manner at the minimum interval of 3 µm. On the surface of the obtained mold, chrome plating was performed to give an anti-corrosion property and durability, and thus a flat mold having a transferring portion of a recessed and projected structure was obtained.

Production Example 4

(Production of Flat Mold Having Quadrangular Pyramidal Transferring Portion of Recessed and Projected Structure)

On 100 mm-square stainless steel flat mold, electroless nickel-phosphorus plating with a thickness of 200 µm and a Vickers hardness of 500 Hv was performed. The electroless nickel-phosphorus surface was subjected to cutting processing using a single crystal diamond bite having a tip radius of 20 mm so that the flat mold was subjected to mirror surface finishing. Next, cutting processing was performed using a single crystal diamond bite having a point angle of 90° in two directions perpendicular to a V-shaped groove having a pitch of 50 µm and a depth of 25 µm to thereby obtain a flat mold having a quadrangular pyramidal transferring portion of a recessed and projected structure.

Example 1

A mixture obtained by mixing 80% of the active energy ray curable composition A and 20% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL. On the light emitting surface side of the organic EL light-emitting element A, Cargille standard refractive index liquid (refractive index of 1.52, manufactured by MORITEX Corporation) was coated as an adhesive layer, and the surface of the base material of the obtained light extraction film for EL was subjected to optical adhesion to thereby obtain a surface light-emitting body. The light extraction efficiency and the amount of chromatic variation of the obtained surface light-emitting body are shown in Table 1.

Comparative Example 1

The active energy ray curable composition A was coated on the flat mold having a hemispherical transferring portion of a recessed and projected structure obtained in Production Example 3 and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the total thickness of the intermediate layer and the diffusion layer became 10 µm. Thereafter, ultraviolet rays were irradiated from the top of the base material to cure the active energy ray curable composition A and the flat mold was released to thereby obtain a light extraction film for EL. An image obtained by photographing the obtained light extraction film for EL by a scanning microscope is shown in FIG. 7.

A surface light-emitting body was obtained by performing the same operation as in Example 1, except the light extraction film for EL to be used. The light extraction efficiency and the amount of chromatic variation of the obtained surface light-emitting body are shown in Table 1.

Example 2

A mixture obtained by mixing 80% of the active energy ray curable composition A and 20% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, 95% of the active energy ray curable composition A and 5% of the light-diffusion fine particles A were coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Comparative Example 2

A mixture obtained by mixing 80% of the active energy ray curable composition A and 20% of the light-diffusion fine particles A was coated on the flat mold having a hemispherical transferring portion of a recessed and projected structure obtained in Production Example 3 and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the total thickness of the intermediate layer and the diffusion layer became 10 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 3

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Comparative Example 3

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the total thickness of the intermediate layer and the diffusion layer became 10 μm. Thereafter, ultraviolet rays were irradiated from the top of the base material to cure the active energy ray curable composition A and the mirror stainless steel plate was released to thereby obtain a diffusion sheet having the diffusion layer on the base material. A surface light-emitting body was obtained by performing the same operation as in Example 1, except the light extraction film for EL to be used. The light extraction efficiency and the amount of chromatic variation of the obtained surface light-emitting body are shown in Table 1.

Example 4

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 10 μm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition A and the flat mold was released to thereby obtain a light extraction film for EL.

An image obtained by photographing the obtained light extraction film for EL by a scanning microscope is shown in FIG. 6. Regarding the size of the recessed and projected structure of the optical film calculated from the image photographed by a scanning microscope, the average maximum diameter $A_{ave}$ was 48 μm and the average height $B_{ave}$ was 24 μm, and hemispherical projections roughly corresponding to the size of the depressions of the roll mold were obtained. Furthermore, from the image photographed by a scanning microscope, the recessed and projected structure of the obtained light extraction film for EL corresponded to the roll mold and was arranged in a hexagonal alignment manner at the minimum interval of 10 μm. The ratio of the area of the bottom surface portion of the recessed and projected structure to the area of the light extraction film for EL was 73%.

A surface light-emitting body was obtained by performing the same operation as in Example 1, except the light extraction film for EL to be used. The light extraction efficiency and the amount of chromatic variation of the obtained surface light-emitting body are shown in Table 1.

Example 5

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 20 μm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 6

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 30 μm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 7

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition B was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition B and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 8

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 10 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition B was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition B and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 9

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 20 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition B was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition B and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 10

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 30 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition B was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition B and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Comparative Example 4

The active energy ray curable composition A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 5 μm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition B was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition B and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 11

A mixture obtained by mixing 70% of the active energy ray curable composition B and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 5 μm. Thereafter, ultraviolet rays were irradiated from the top of the base material to cure the active energy ray curable composition B and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 12

A mixture obtained by mixing 70% of the active energy ray curable composition B and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 10 μm. Thereafter, ultraviolet rays were irradiated from the top of the base material to cure the active energy ray curable composition B and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 13

A mixture obtained by mixing 70% of the active energy ray curable composition B and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 20 μm. Thereafter, ultraviolet rays were irradiated from the top of the base material to cure the active energy ray curable composition B and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 14

A mixture obtained by mixing 70% of the active energy ray curable composition B and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 30 µm. Thereafter, ultraviolet rays were irradiated from the top of the base material to cure the active energy ray curable composition B and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Comparative Example 5

The active energy ray curable composition B was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition B and the mirror stainless steel plate was released to thereby obtain a diffusion sheet having the diffusion layer on the base material.

Next, the active energy ray curable composition A was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Comparative Example 6

A mixture obtained by mixing 70% of the active energy ray curable composition B and 30% of the light-diffusion fine particles A was coated on the flat mold having a hemispherical transferring portion of a recessed and projected structure obtained in Production Example 3 and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the total thickness of the intermediate layer and the diffusion layer became 10 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 15

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, the active energy ray curable composition A was coated on the flat mold having a quadrangular pyramidal transferring portion of a recessed and projected structure obtained in Production Example 4 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Example 16

A mixture obtained by mixing 70% of the active energy ray curable composition A and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 µm was disposed thereon, followed by being evenly stretched using a nip roll such that the thickness of the diffusion layer became 5 µm. Thereafter, ultraviolet rays were irradiated from the top of the base material to cure the active energy ray curable composition A and the mirror stainless steel plate was released to thereby obtain a diffusion sheet having the diffusion layer on the base material.

Next, 95% of the active energy ray curable composition A and 5% of the light-diffusion fine particles A were coated on the flat mold having a quadrangular pyramidal transferring portion of a recessed and projected structure obtained in Production Example 4 and the obtained diffusion sheet was disposed thereon such that the surface having the diffusion layer faced downward, followed by being evenly stretched using a nip roll such that the thickness of the intermediate layer became 5 µm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Comparative Example 7

The active energy ray curable composition A was coated on the flat mold having a quadrangular pyramidal transferring portion of a recessed and projected structure obtained in Production Example 4 and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the total thickness of the intermediate layer and the diffusion layer became 10 μm. Thereafter, ultraviolet rays were irradiated from the top of the base material to cure the active energy ray curable composition A and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

Examples 17 to 20

Surface light-emitting bodies of Examples 17 to 20 were obtained by performing the same operation as in Examples 11 to 14, except that the organic EL light-emitting element B was used instead of the organic EL light-emitting element A. The light extraction efficiency and the amount of chromatic variation of the obtained surface light-emitting body are shown in Table 2.

Example 21

A mixture obtained by mixing 70% of the active energy ray curable composition B and 30% of the light-diffusion fine particles A was coated on a mirror stainless steel plate and a polyethylene terephthalate base material (trade name "DIAFOIL T910E125," manufactured by Mitsubishi Plastics, Inc.) with a thickness of 125 μm was disposed thereon, followed by being evenly stretched using a nip roll such that the thickness of the diffusion layer became 5 μm. Thereafter, ultraviolet rays were irradiated from the top of the base material to cure the active energy ray curable composition B

TABLE 1

| | Diffusion layer | | | | Recessed and projected structure layer | | | | | Surface light-emitting body | | |
|---|---|---|---|---|---|---|---|---|---|---|---|---|
| | Refractive index of resin | Refractive index of particle | Content ratio of particle (%) | Thickness of diffusion layer (mm) | Refractive index of resin | Refractive index of particle | Content ratio of particle (%) | Thickness of diffusion layer (μm) | Shape of recessed and projected structure | Light extraction efficiency (%) | Luminance in normal direction (%) | Amount of chromatic variation Δu'v' |
| Reference Example 1 | — | — | — | — | — | — | — | — | — | 100 | 100 | 0.012 |
| Example 1 | 1.52 | 1.42 | 20 | 5 | 1.52 | — | 0 | 5 | Hemispherical | 179.3 | 157.6 | 0.005 |
| Example 2 | 1.52 | 1.42 | 20 | 5 | 1.52 | 1.42 | 5 | 5 | Hemispherical | 175.1 | 159.9 | 0.002 |
| Comparative Example 1 | 1.52 | — | 0 | 5 | 1.52 | — | 0 | 5 | Hemispherical | 176.3 | 158.2 | 0.007 |
| Comparative Example 2 | 1.52 | 1.42 | 20 | 5 | 1.52 | — | 20 | 5 | Hemispherical | 174.7 | 161 | 0.002 |
| Example 3 | 1.52 | 1.42 | 30 | 5 | 1.52 | — | 0 | 5 | Hemispherical | 181.2 | 164.2 | 0.005 |
| Example 4 | 1.52 | 1.42 | 30 | 10 | 1.52 | — | 0 | 5 | Hemispherical | 182 | 165.8 | 0.004 |
| Example 5 | 1.52 | 1.42 | 30 | 20 | 1.52 | — | 0 | 5 | Hemispherical | 181.5 | 171.8 | 0.002 |
| Example 6 | 1.52 | 1.42 | 30 | 30 | 1.52 | — | 0 | 5 | Hemispherical | 179.6 | 168.8 | 0.002 |
| Comparative Example 1 | 1.52 | — | 0 | 5 | 1.52 | — | 0 | 5 | Hemispherical | 176.3 | 158.2 | 0.007 |
| Comparative Example 3 | 1.52 | 1.42 | 30 | 5 | 1.52 | 1.42 | 30 | 5 | Hemispherical | 174.9 | 161.6 | 0.002 |
| Example 7 | 1.52 | 1.42 | 30 | 5 | 1.52 | — | 0 | 5 | Hemispherical | 181.1 | 169.1 | 0.006 |
| Example 8 | 1.52 | 1.42 | 30 | 5 | 1.52 | 1.42 | 5 | 5 | Hemispherical | 180.8 | 170.5 | 0.005 |
| Example 9 | 1.52 | 1.42 | 30 | 5 | 1.62 | — | 0 | 5 | Hemispherical | 181.1 | 169.8 | 0.003 |
| Example 10 | 1.52 | 1.42 | 30 | 10 | 1.62 | — | 0 | 5 | Hemispherical | 175.9 | 172 | 0.002 |
| Comparative Example 3 | 1.52 | 1.42 | 30 | 5 | 1.52 | 1.42 | 30 | 5 | Hemispherical | 174.9 | 161.6 | 0.002 |
| Comparative Example 4 | 1.52 | — | 0 | 5 | 1.52 | — | 0 | 5 | Quadrangular pyramidal | 183.4 | 169.2 | 0.008 |
| Example 11 | 1.52 | 1.42 | 30 | 20 | 1.62 | — | 0 | 5 | Hemispherical | 183.5 | 168.6 | 0.004 |
| Example 12 | 1.52 | 1.42 | 30 | 30 | 1.62 | — | 0 | 5 | Hemispherical | 179.5 | 168 | 0.002 |
| Example 13 | 1.62 | 1.42 | 30 | 5 | 1.52 | — | 0 | 5 | Hemispherical | 176.5 | 169.1 | 0.002 |
| Example 14 | 1.62 | 1.42 | 30 | 10 | 1.52 | — | 0 | 5 | Hemispherical | 175.2 | 168.8 | 0.001 |
| Comparative Example 1 | 1.52 | — | 0 | 5 | 1.52 | — | 0 | 5 | Hemispherical | 176.3 | 158.2 | 0.007 |
| Comparative Example 5 | 1.52 | — | 0 | 5 | 1.52 | — | 0 | 5 | Hemispherical | 182.1 | 160.4 | 0.007 |
| Comparative Example 6 | 1.6 | 1.42 | 30 | 5 | 1.6 | 1.42 | 30 | 5 | Hemispherical | 168.3 | 165.1 | 0.001 |
| Example 15 | 1.62 | 1.42 | 30 | 5 | 1.52 | — | 0 | 5 | Quadrangular pyramidal | 175.4 | 166.7 | 0.005 |
| Example 16 | 1.62 | 1.42 | 30 | 5 | 1.52 | 1.42 | 5 | 5 | Quadrangular pyramidal | 175.1 | 169.5 | 0.004 |
| Comparative Example 7 | 1.52 | — | 0 | 5 | 1.52 | — | 0 | 5 | Quadrangular pyramidal | 174 | 200.2 | 0.011 | and the mirror stainless steel plate was released to thereby obtain a diffusion sheet having the diffusion layer on the base material.

Next, the active energy ray curable composition B was coated on the flat mold having a hemispherical transferring portion of a recessed and projected structure obtained in Production Example 3 and the obtained diffusion sheet was disposed thereon such that the surface having the diffusion layer faced downward, followed by being evenly stretched using a nip roll such that the thickness of the intermediate layer became 5 μm. Thereafter, ultraviolet rays were irradiated from the top of the base material to cure the active energy ray curable composition B and the flat mold was released to thereby obtain a light extraction film for EL.

A surface light-emitting body was obtained by performing the same operation as in Example 1, except the light extraction film for EL to be used. The light extraction efficiency and the amount of chromatic variation of the obtained surface light-emitting body are shown in Table 1.

On the light emitting surface side of the organic EL light-emitting element B, Cargille standard refractive index liquid (refractive index of 1.52, manufactured by MORITEX Corporation) was coated as an adhesive layer, and the surface of the base material of the obtained light extraction film for EL was subjected to optical adhesion to thereby obtain a surface light-emitting body. The light extraction efficiency and the amount of chromatic variation of the obtained surface light-emitting body are shown in Table 2.

Examples 22 to 24

Surface light-emitting bodies of Examples 22 to 24 were obtained by performing the same operation as in Example 21, except that the thicknesses of the diffusion layer were set to 10 μm, 20 μm, and 30 μm. The light extraction efficiency and the amount of chromatic variation of the obtained surface light-emitting body are shown in Table 2.

Comparative Example 8

A surface light-emitting body of Comparative Example 8 was obtained by performing the same operation as in Comparative Example 6, except that the organic EL light-emitting element B was used instead of the organic EL light-emitting element A. The light extraction efficiency and the amount of chromatic variation of the obtained surface light-emitting body are shown in Table 2.

Comparative Examples 9 to 11

Surface light-emitting bodies of Comparative Examples 9 to 11 were obtained by performing the same operation as in Comparative Example 8, except that the thicknesses of the diffusion layer were set to 10 μm, 20 μm, and 30 μm. The light extraction efficiency and the amount of chromatic variation of the obtained surface light-emitting bodies are shown in Table 2.

Examples 25 to 32

Surface light-emitting bodies of Examples 25 to 32 were obtained by performing the same operation as in Examples 3 to 10, except that the organic EL light-emitting element B was used instead of the organic EL light-emitting element A. The light extraction efficiency and the amount of chromatic variation of the obtained surface light-emitting body are shown in Table 2.

Comparative Example 12

A surface light-emitting body of Comparative Example 12 was obtained by performing the same operation as in Comparative Example 3, except that the organic EL light-emitting element B was used instead of the organic EL light-emitting element A. The light extraction efficiency and the amount of chromatic variation of the obtained surface light-emitting body are shown in Table 2.

Comparative Examples 13 to 15

Surface light-emitting bodies of Comparative Examples 13 to 15 were obtained by performing the same operation as in Comparative Example 12, except that the thicknesses of the diffusion layer were set to 10 μm, 20 μm, and 30 μm. The light extraction efficiency and the amount of chromatic variation of the obtained surface light-emitting bodies are shown in Table 2.

TABLE 2

| | Diffusion layer | | | | Recessed and projected structure layer | | | | | Surface light-emitting body | | |
| --- | --- | --- | --- | --- | --- | --- | --- | --- | --- | --- | --- | --- |
| | Refractive index of resin | Refractive index of particle | Content ratio of particle (%) | Thickness of diffusion layer (mm) | Refractive index of resin | Refractive index of particle | Content ratio of particle (%) | Thickness of intermediate layer (mm) | Shape of recessed and projected structure | Light extraction efficiency (%) | Luminance in normal direction (%) | Amount of chromatic variation Δu'v' |
| Reference Example 2 | — | — | — | — | — | — | — | — | — | 100 | 100 | 0.014 |
| Example 17 | 1.60 | 1.42 | 30 | 5 | 1.52 | — | 0 | 5 | Hemispherical | 223.7% | 202.9% | 0.004 |
| Example 18 | 1.60 | 1.42 | 30 | 10 | 1.52 | — | 0 | 5 | Hemispherical | 222.7% | 215.7% | 0.002 |
| Example 19 | 1.60 | 1.42 | 30 | 20 | 1.52 | — | 0 | 5 | Hemispherical | 220.0% | 223.3% | 0.001 |
| Example 20 | 1.60 | 1.42 | 30 | 30 | 1.52 | — | 0 | 5 | Hemispherical | 217.5% | 224.9% | 0.000 |
| Example 21 | 1.60 | 1.42 | 30 | 5 | 1.60 | — | 0 | 5 | Hemispherical | 222.8% | 208.9% | 0.004 |
| Example 22 | 1.60 | 1.42 | 30 | 10 | 1.60 | — | 0 | 5 | Hemispherical | 221.4% | 214.8% | 0.002 |
| Example 23 | 1.60 | 1.42 | 30 | 20 | 1.60 | — | 0 | 5 | Hemispherical | 218.7% | 221.9% | 0.001 |
| Example 24 | 1.60 | 1.42 | 30 | 30 | 1.60 | — | 0 | 5 | Hemispherical | 216.2% | 225.7% | 0.000 |
| Comparative Example 8 | 1.60 | 1.42 | 30 | 5 | 1.60 | 1.42 | 30 | 5 | Hemispherical | 214.9% | 217.9% | 0.001 |
| Comparative Example 9 | 1.60 | 1.42 | 30 | 10 | 1.60 | 1.42 | 30 | 5 | Hemispherical | 212.8% | 221.6% | 0.000 |

TABLE 2-continued

| | Diffusion layer | | | | Recessed and projected structure layer | | | | | Surface light-emitting body | | |
|---|---|---|---|---|---|---|---|---|---|---|---|---|
| | Refractive index of resin | Refractive index of particle | Content ratio of particle (%) | Thickness of diffusion layer (mm) | Refractive index of resin | Refractive index of particle | Content ratio of particle (%) | Thickness of intermediate layer (mm) | Shape of recessed and projected structure | Light extraction efficiency (%) | Luminance in normal direction (%) | Amount of chromatic variation Δu'v' |
| Comparative Example 10 | 1.60 | 1.42 | 30 | 20 | 1.60 | 1.42 | 30 | 5 | Hemispherical | 211.9% | 222.3% | 0.000 |
| Comparative Example 11 | 1.60 | 1.42 | 30 | 30 | 1.60 | 1.42 | 30 | 5 | Hemispherical | 210.1% | 221.0% | 0.000 |
| Example 25 | 1.52 | 1.42 | 30 | 5 | 1.52 | — | 0 | 5 | Hemispherical | 221.8% | 185.4% | 0.008 |
| Example 26 | 1.52 | 1.42 | 30 | 10 | 1.52 | — | 0 | 5 | Hemispherical | 219.9% | 191.0% | 0.005 |
| Example 27 | 1.52 | 1.42 | 30 | 20 | 1.52 | — | 0 | 5 | Hemispherical | 218.6% | 205.8% | 0.003 |
| Example 28 | 1.52 | 1.42 | 30 | 30 | 1.52 | — | 0 | 5 | Hemispherical | 218.5% | 214.2% | 0.002 |
| Example 29 | 1.52 | 1.42 | 30 | 5 | 1.60 | — | 0 | 5 | Hemispherical | 219.3% | 195.8% | 0.008 |
| Example 30 | 1.52 | 1.42 | 30 | 10 | 1.60 | — | 0 | 5 | Hemispherical | 218.3% | 204.1% | 0.004 |
| Example 31 | 1.52 | 1.42 | 30 | 20 | 1.60 | — | 0 | 5 | Hemispherical | 217.1% | 211.1% | 0.003 |
| Example 32 | 1.52 | 1.42 | 30 | 30 | 1.60 | — | 0 | 5 | Hemispherical | 216.4% | 216.6% | 0.002 |
| Comparative Example 12 | 1.52 | 1.42 | 30 | 5 | 1.52 | 1.42 | 30 | 5 | Hemispherical | 216.0% | 207.2% | 0.002 |
| Comparative Example 13 | 1.52 | 1.42 | 30 | 10 | 1.52 | 1.42 | 30 | 5 | Hemispherical | 215.8% | 206.7% | 0.002 |
| Comparative Example 14 | 1.52 | 1.42 | 30 | 20 | 1.52 | 1.42 | 30 | 5 | Hemispherical | 215.2% | 215.8% | 0.001 |
| Comparative Example 15 | 1.52 | 1.42 | 30 | 30 | 1.52 | 1.42 | 30 | 5 | Hemispherical | 214.9% | 217.3% | 0.001 |

Examples 33 to 39

Surface light-emitting bodies of Examples 33 to 39 were obtained by performing the same operation as in Examples 17 to 23, except that the organic EL light-emitting element C was used instead of the organic EL light-emitting element B. The light extraction efficiency and the amount of chromatic variation of the obtained surface light-emitting body are shown in Table 3.

Comparative Examples 16 to 19

Surface light-emitting bodies of Comparative Examples 16 to 19 were obtained by performing the same operation as in Comparative Examples 8 to 11, except that the organic EL light-emitting element C was used instead of the organic EL light-emitting element B. The light extraction efficiency and the amount of chromatic variation of the obtained surface light-emitting body are shown in Table 3.

Examples 40 to 47

Surface light-emitting bodies of Examples 40 to 47 were obtained by performing the same operation as in Examples 25 to 32, except that the organic EL light-emitting element C was used instead of the organic EL light-emitting element B. The light extraction efficiency and the amount of chromatic variation of the obtained surface light-emitting body are shown in Table 3.

TABLE 3

| | Diffusion layer | | | | Recessed and projected structure layer | | | | | Surface light-emitting body | | |
|---|---|---|---|---|---|---|---|---|---|---|---|---|
| | Refractive index of resin | Refractive index of particle | Content ratio of particle (%) | Thickness of diffusion layer (mm) | Refractive index of resin | Refractive index of particle | Content ratio of particle (%) | Thickness of intermediate layer (mm) | Shape of recessed and projected structure | Light extraction efficiency (%) | Luminance in normal direction (%) | Amount of chromatic variation Δu'v' |
| Reference Example 3 | — | — | — | — | — | — | — | — | — | 100 | 100 | 0.010 |
| Example 33 | 1.60 | 1.42 | 30 | 5 | 1.52 | — | 0 | 5 | Hemispherical | 148.1% | 130.8% | 0.010 |
| Example 34 | 1.60 | 1.42 | 30 | 10 | 1.52 | — | 0 | 5 | Hemispherical | 145.9% | 127.8% | 0.006 |
| Example 35 | 1.60 | 1.42 | 30 | 20 | 1.52 | — | 0 | 5 | Hemispherical | 142.8% | 125.2% | 0.002 |
| Example 36 | 1.60 | 1.42 | 30 | 30 | 1.52 | — | 0 | 5 | Hemispherical | 139.1% | 122.7% | 0.001 |
| Example 37 | 1.60 | 1.42 | 30 | 5 | 1.60 | — | 0 | 5 | Hemispherical | 142.9% | 128.3% | 0.011 |
| Example 38 | 1.60 | 1.42 | 30 | 10 | 1.60 | — | 0 | 5 | Hemispherical | 144.8% | 129.6% | 0.007 |
| Example 39 | 1.60 | 1.42 | 30 | 20 | 1.60 | — | 0 | 5 | Hemispherical | 141.4% | 126.1% | 0.003 |
| Comparative Example 16 | 1.60 | 1.42 | 30 | 5 | 1.60 | 1.42 | 30 | 5 | Hemispherical | 138.5% | 124.3% | 0.003 |
| Comparative Example 17 | 1.60 | 1.42 | 30 | 10 | 1.60 | 1.42 | 30 | 5 | Hemispherical | 136.2% | 121.9% | 0.001 |
| Comparative Example 18 | 1.60 | 1.42 | 30 | 20 | 1.60 | 1.42 | 30 | 5 | Hemispherical | 135.1% | 120.6% | 0.001 |
| Comparative Example 19 | 1.60 | 1.42 | 30 | 30 | 1.60 | 1.42 | 30 | 5 | Hemispherical | 133.4% | 118.3% | 0.001 |
| Example 40 | 1.52 | 1.42 | 30 | 5 | 1.52 | — | 0 | 5 | Hemispherical | 147.1% | 134.5% | 0.015 |

TABLE 3-continued

|  | Diffusion layer | | | | Recessed and projected structure layer | | | | | Surface light-emitting body | | |
| --- | --- | --- | --- | --- | --- | --- | --- | --- | --- | --- | --- | --- |
|  | Refractive index of resin | Refractive index of particle | Content ratio of particle (%) | Thickness of diffusion layer (mm) | Refractive index of resin | Refractive index of particle | Content ratio of particle (%) | Thickness of intermediate layer (mm) | Shape of recessed and projected structure | Light extraction efficiency (%) | Luminance in normal direction (%) | Amount of chromatic variation Δu'v' |
| Example 41 | 1.52 | 1.42 | 30 | 10 | 1.52 | — | 0 | 5 | Hemispherical | 146.5% | 131.1% | 0.013 |
| Example 42 | 1.52 | 1.42 | 30 | 20 | 1.52 | — | 0 | 5 | Hemispherical | 144.0% | 127.6% | 0.008 |
| Example 43 | 1.52 | 1.42 | 30 | 30 | 1.52 | — | 0 | 5 | Hemispherical | 142.9% | 126.3% | 0.006 |
| Example 44 | 1.52 | 1.42 | 30 | 5 | 1.60 | — | 0 | 5 | Hemispherical | 144.3% | 133.8% | 0.014 |
| Example 45 | 1.52 | 1.42 | 30 | 10 | 1.60 | — | 0 | 5 | Hemispherical | 143.5% | 133.7% | 0.012 |
| Example 46 | 1.52 | 1.42 | 30 | 20 | 1.60 | — | 0 | 5 | Hemispherical | 141.7% | 130.4% | 0.009 |
| Example 47 | 1.52 | 1.42 | 30 | 30 | 1.60 | — | 0 | 5 | Hemispherical | 139.2% | 128.0% | 0.006 |

Regarding the light extraction film for EL obtained in each of Examples 1 and 2, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in Example 1, Px−Py is 20% by mass, and in the surface light-emitting body obtained in Example 1, Px−Py is 15% by mass. It was possible to confirm that the surface light-emitting body, which has been obtained in each of Examples 1 and 2, including the light extraction film for EL of the invention is excellent in light extraction efficiency and luminance in the normal direction, and the amount of chromatic variation is small so that the emission angle dependence of the wavelength of emitted light is suppressed.

On the other hand, regarding the light extraction film for EL obtained in each of Comparative Example 1 and 2, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in each of Comparative Example 1 and Comparative Example 2, Px−Py is 0% by mass. It was confirmed that the surface light-emitting body obtained in Comparative Example 1 has a large amount of chromatic variation and it is not possible to suppress the emission angle dependence of the wavelength of emitted light. In addition, the surface light-emitting body obtained in Comparative Example 2 was inferior in the light extraction efficiency.

Regarding the light extraction film for EL obtained in each of Examples 3 to 6, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 3 to 6, Px−Py is 30% by mass. It was possible to confirm that the surface light-emitting body, which has been obtained in each of Examples 3 to 6, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 3 to 6, it was found that, even when the thickness of the diffusion layer is increased to 30 μm, the surface light-emitting body is excellent in light extraction efficiency and luminance in the normal direction and it is possible to suppress the emission angle dependence of the wavelength of emitted light.

On the other hand, regarding the light extraction film for EL obtained in Comparative Example 3, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in Comparative Example 3, Px−Py is 0% by mass. The surface light-emitting body obtained in Comparative Example 3 was inferior in the light extraction efficiency to the surface light-emitting bodies obtained in each of Examples 3 to 6.

Regarding the light extraction film for EL obtained in each of Examples 7 to 10, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 7 to 10, Px−Py is 30% by mass. It was possible to confirm that the surface light-emitting body, which has been obtained in each of Examples 7 to 10, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 7 to 10, it was found that, even when the resin of the diffusion layer and the resin of the recessed and projected structure layer are different from each other, the surface light-emitting body is excellent in light extraction efficiency and luminance in the normal direction and it is possible to suppress the emission angle dependence of the wavelength of emitted light. Further, it was confirmed that, when the refractive index of the resin of the diffusion layer is smaller than the refractive index of the resin of the recessed and projected structure layer, the luminance in the normal direction is further improved.

On the other hand, regarding the light extraction film for EL obtained in Comparative Example 4, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in Comparative Example 4, Px−Py is 0% by mass. The surface light-emitting body obtained in Comparative Example 4 was inferior in the emission angle dependence of the wavelength of emitted light.

Regarding the light extraction film for EL obtained in each of Examples 11 to 14, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 11 to 14, Px−Py is 30% by mass. It was possible to confirm that the surface light-emitting body, which has been obtained in each of Examples 11 to 14, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 11 to 14, it was found that, even when the resin of the diffusion layer and the resin of the recessed and projected structure layer are different from each other, the surface light-emitting body is excellent in light extraction efficiency and luminance in the normal direction and it is possible to suppress the emission angle dependence of the wavelength of emitted light.

On the other hand, regarding the light extraction film for EL obtained in each of Comparative Example 5 and Comparative Example 6, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in each of Comparative Example 5 and Comparative Example 6, Px−Py is 0% by mass. The surface light-emitting body obtained in each of Comparative Example 5 and Comparative Example 6 was inferior in the emission angle dependence of the wavelength of emitted light.

Regarding the light extraction film for EL obtained in each of Example 15 and Example 16, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in Example 15, Px−Py is 30% by mass, and in the surface light-emitting body obtained in Example 16, Px−Py is 25% by mass. It was possible to confirm that the surface light-emitting body, which has been obtained in each of Example 15 and Example 16, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Example 15 and Example 16, it was found that, even when the recessed and projected structure is a quadrangular pyramidal shape, the surface light-emitting body is excellent in light extraction efficiency and luminance in the normal direction and it is possible to suppress the emission angle dependence of the wavelength of emitted light.

On the other hand, regarding the light extraction film for EL obtained in Comparative Example 7, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in Comparative Example 7, Px−Py is 0% by mass. The surface light-emitting body obtained in Comparative Example 7 was inferior in the emission angle dependence of the wavelength of emitted light.

Regarding the light extraction film for EL obtained in each of Examples 17 to 20, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 17 to 20, Px−Py is 30% by mass. It was possible to confirm that the surface light-emitting body, which has been obtained in each of Examples 17 to 20, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 17 to 20, it was found that, even when the resin of the diffusion layer and the resin of the recessed and projected structure layer are different from each other, the surface light-emitting body is excellent in light extraction efficiency and luminance in the normal direction and it is possible to suppress the emission angle dependence of the wavelength of emitted light.

Regarding the light extraction film for EL obtained in each of Examples 21 to 24, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in Example 1, Px−Py is 30% by mass. It was possible to confirm that the surface light-emitting body, which has been obtained in each of Examples 21 to 24, including the light extraction film for EL of the invention is excellent in light extraction efficiency and luminance in the normal direction, and the amount of chromatic variation is small so that the emission angle dependence of the wavelength of emitted light is suppressed.

On the other hand, regarding the light extraction film for EL obtained in each of Comparative Examples 8 to 11, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in each of Comparative Examples 8 to 11, Px−Py is 0% by mass. The surface light-emitting body obtained in each of Comparative Examples 8 to 11 was inferior in the light extraction efficiency.

Regarding the light extraction film for EL obtained in each of Examples 25 to 28, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 25 to 28, Px−Py is 30% by mass. It was possible to confirm that the surface light-emitting body, which has been obtained in each of Examples 25 to 28, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 25 to 28, it was found that, even when the thickness of the diffusion layer is increased to 30 μm, the surface light-emitting body is excellent in light extraction efficiency and luminance in the normal direction and it is possible to suppress the emission angle dependence of the wavelength of emitted light.

On the other hand, regarding the light extraction film for EL obtained in each of Comparative Examples 12 to 15, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in each of Comparative Examples 12 to 15, Px−Py is 0% by mass. The surface light-emitting body obtained in each of Comparative Examples 12 to 15 was inferior in the light extraction efficiency to the surface light-emitting bodies obtained in each of Examples 25 to 28.

Regarding the light extraction film for EL obtained in each of Examples 29 to 32, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 29 to 32, Px−Py is 30% by mass. It was possible to confirm that the surface light-emitting body, which has been obtained in each of Examples 29 to 32, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 29 to 32, it was found that, even when the resin of the diffusion layer and the resin of the recessed and projected structure layer are different from each other, the surface light-emitting body is excellent in light extraction efficiency and luminance in the normal direction and it is possible to suppress the emission angle dependence of the wavelength of emitted light. Further, it was confirmed that, when the refractive index of the resin of the diffusion layer is smaller than the refractive index of the resin of the recessed and projected structure layer, the luminance in the normal direction is further improved.

Regarding the light extraction film for EL obtained in each of Examples 33 to 36, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 33 to 36, Px−Py is 30% by mass. It was possible to confirm that the surface light-emitting body, which has been obtained in each of Examples 33 to 36, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 33 to 36, it was found that, even when the resin of the diffusion layer and the resin of the recessed and projected structure layer are different from each other, the surface light-emitting body is excellent in light extraction efficiency and luminance in the normal direction and it is possible to suppress the emission angle dependence of the wavelength of emitted light.

Regarding the light extraction film for EL obtained in each of Examples 37 to 39, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in Example 1, Px−Py is 30% by mass. It was possible to confirm that the surface light-emitting body, which has been obtained in each of Examples 37 to 39, including the light extraction film for EL of the invention is excellent in light extraction efficiency and luminance in the normal direction, and the amount of chromatic variation is small so that the emission angle dependence of the wavelength of emitted light is suppressed.

On the other hand, regarding the light extraction film for EL obtained in each of Comparative Examples 16 to 19, the relation between the content ratio Px of the light-diffusion fine particles to the total mass of the diffusion layer and the content ratio Py of the light-diffusion fine particles to the total mass of the recessed and projected structure layer does not satisfy Px−Py≥5% by mass. Specifically, in the surface light-emitting body obtained in each of Comparative Examples 16 to 19, Px−Py is 0% by mass. The surface light-emitting body obtained in each of Comparative Examples 16 to 19 was inferior in the light extraction efficiency and the luminance in the normal direction.

Regarding the light extraction film for EL obtained in each of Examples 40 to 43, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 40 to 43, Px−Py is 30% by mass. It was possible to confirm that the surface light-emitting body, which has been obtained in each of Examples 40 to 43, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 40 to 43, it was found that, even when the thickness of the diffusion layer is increased to 30 μm, the surface light-emitting body is excellent in light extraction efficiency and luminance in the normal direction and it is possible to suppress the emission angle dependence of the wavelength of emitted light.

Regarding the light extraction film for EL obtained in each of Examples 44 to 47, the relation between the content ratio Px of the light-diffusion fine particles to the total mass of the diffusion layer and the content ratio Py of the light-diffusion fine particles to the total mass of the recessed and projected structure layer satisfies Px−Py≥5% by mass. Specifically, in the surface light-emitting body obtained in each of Examples 44 to 47, Px−Py is 30% by mass. It was possible to confirm that the surface light-emitting body, which has been obtained in each of Examples 44 to 47, including the light extraction film for EL of the invention is excellent in light extraction efficiency and luminance in the normal direction, and the amount of chromatic variation is small so that the emission angle dependence of the wavelength of emitted light is suppressed. In addition, from the results obtained in Examples 44 to 47, it was found that, even when the resin of the diffusion layer and the resin of the recessed and projected structure layer are different from each other, the surface light-emitting body is excellent in light extraction efficiency and luminance in the normal direction and it is possible to suppress the emission angle dependence of the wavelength of emitted light. Further, it was confirmed that, when the refractive index of the resin of the diffusion layer is smaller than the refractive index of the resin of the recessed and projected structure layer, the luminance in the normal direction is further improved.

INDUSTRIAL APPLICABILITY

According to the light extraction film for EL of the invention, it is possible to obtain a surface light-emitting body in which a balance between improvement in light extraction efficiency and suppression of emission angle dependence of the wavelength of emitted light is achieved, and this surface light-emitting body can be used suitably for, for example, lighting devices, displays, or screens.

EXPLANATIONS OF LETTERS OR NUMERALS

10 LIGHT EXTRACTION FILM FOR EL
11 RECESSED AND PROJECTED STRUCTURE LAYER
12 DIFFUSION LAYER
13 INTERMEDIATE LAYER
14 RECESSED AND PROJECTED STRUCTURE
15 BOTTOM SURFACE PORTION OF RECESSED AND PROJECTED STRUCTURE
16 BASE MATERIAL
21 ADHESIVE LAYER
22 PROTECTIVE FILM
30 EL LIGHT-EMITTING ELEMENT
31 GLASS SUBSTRATE
32 POSITIVE ELECTRODE
33 LIGHT EMITTING LAYER
34 NEGATIVE ELECTRODE

The invention claimed is:

1. A light extraction film for EL, comprising a diffusion layer and a recessed and projected structure layer, wherein
the diffusion layer includes first light-diffusion fine particles,
the recessed and projected structure layer includes substantially no second light-diffusion fine particles,
the following Expression (1) is satisfied, $$Px-Py \geq 5\% \text{ by mass} \quad (1)$$

(Px represents a content ratio of the first light-diffusion fine particles to the total mass of the diffusion layer; and Py represents a content ratio of the second light-diffusion fine particles to the total mass of the recessed and projected structure layer),
the diffusion layer has a thickness of 40 µm or less, and the first light-diffusion fine particles have a volume average particle diameter ranging from 1 µm to 10 µm.

2. The light extraction film for EL according to claim 1, further comprising a base material, wherein
the diffusion layer and the recessed and projected structure layer are sequentially provided on the base material.

3. The light extraction film for EL according to claim 1, wherein the content ratio Px of the first light-diffusion fine particles to the total mass of the diffusion layer is 10% by mass or more.

4. The light extraction film for EL according to claim 1, wherein a thickness of the diffusion layer is 1 µm to 50 µm.

5. The light extraction film for EL according to claim 1, wherein the content ratio Py of the second light-diffusion fine particles to the total mass of the recessed and projected structure layer is 20% by mass or less.

6. The light extraction film for EL according to claim 1, wherein the diffusion layer has a thickness ranging from 1 µm to 40 µm.

7. The light extraction film for EL according to claim 1, wherein the diffusion layer has a thickness ranging from 2 µm to 40 µm.

8. The light extraction film for EL according to claim 1, wherein the first light-diffusion fine particles have an average particle diameter of 2 µm.

9. The light extraction film for EL according to claim 1, wherein the diffusion layer includes a first resin, and the first light-diffusion fine particles included in the diffusion layer are evenly dispersed in the first resin.

10. The light extraction film for EL according to claim 9, wherein a difference between a refractive index Rxm of the first resin and a refractive index Rxp of the first light-diffusion fine particles included in the diffusion layer is 0.05 to 0.30.

11. The light extraction film for EL according to claim 9, wherein a difference between the refractive index Rxm of the first resin and the refractive index Rxp of the first light-diffusion fine particles included in the diffusion layer is 0.15 to 0.30.

12. The light extraction film for EL according to claim 9, wherein the recessed and projected structure layer includes a second resin, and a refractive index Rym of the second resin is 1.40 to 1.80.

13. The light extraction film for EL according to claim 12, wherein the refractive index Rym of the second resin is 1.55 to 1.80.

14. A surface light-emitting body comprising the light extraction film for EL according to claim 1 and an EL light-emitting element.

15. The surface light-emitting body according to claim 14, wherein an amount of chromatic variation $\Delta u'v'$ of the surface light-emitting body is 0.01 or less.

16. A method for producing a light extraction film for EL, the method comprising:
supplying an active energy ray curable resin composition to a space between a diffusion sheet and a mold having a transferring portion of a recessed and projected structure; and
irradiating the active energy ray curable resin composition with an active energy ray,
wherein the diffusion sheet includes first light-diffusion fine particles and has a thickness of 40 µm or less, and the first light-diffusion fine particles have a volume average particle diameter ranging from 1 µm to 10 µm.

17. The method for producing a light extraction film for EL according to claim 16, wherein the first light-diffusion fine particles have an average particle diameter of 2 µm.

* * * * *